US 6,727,981 B2
Apr. 27, 2004

(12) United States Patent
Taniuchi et al.

(10) Patent No.: US 6,727,981 B2
(45) Date of Patent: Apr. 27, 2004

(54) ILLUMINATING OPTICAL APPARATUS AND MAKING METHOD THEREOF, EXPOSURE APPARATUS AND MAKING METHOD THEREOF, AND DEVICE MANUFACTURING METHOD

(75) Inventors: Taichi Taniuchi, Ageo (JP); Kyoji Nakamura, Kouza-gun (JP); Eizo Ohya, Kumagaya (JP); Hiromitsu Yoshimoto, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/307,963

(22) Filed: Dec. 3, 2002

(65) Prior Publication Data

US 2003/0117600 A1 Jun. 26, 2003

Related U.S. Application Data

(63) Continuation of application No. 09/619,650, filed on Jul. 19, 2000, now abandoned.

(30) Foreign Application Priority Data

Jul. 19, 1999 (JP) ........................................... 11-205148
Jul. 19, 1999 (JP) ........................................... 11-205206

(51) Int. Cl.⁷ .......................... G03B 27/52; G03B 27/54
(52) U.S. Cl. ............................... 355/55; 355/30; 355/67
(58) Field of Search ............................. 355/77, 53, 30, 355/67, 55; 250/492.1, 492.2

(56) References Cited

U.S. PATENT DOCUMENTS

| | | | |
|---|---|---|---|
| 5,541,776 A | * | 7/1996 | Kobayashi et al. ......... 359/665 |
| 5,559,584 A | * | 9/1996 | Miyaji et al. ................ 3355/73 |
| 5,661,546 A | * | 8/1997 | Taniguchi .................... 355/53 |
| 5,717,483 A | * | 2/1998 | Kikuchi |
| 5,861,944 A | * | 1/1999 | Nishi ........................... 355/68 |
| 6,008,885 A | | 12/1999 | Takahashi et al. |
| 6,219,368 B1 | * | 4/2001 | Govorkov ..................... 372/59 |
| 6,235,438 B1 | * | 5/2001 | Suzuki et al. |
| 6,333,775 B1 | * | 12/2001 | Haney et al. .................. 355/30 |
| 6,388,733 B1 | * | 5/2002 | Hayashi ....................... 355/53 |
| 6,441,884 B1 | * | 8/2002 | Takahashi et al. ............. 355/53 |
| 6,522,384 B2 | * | 2/2003 | Miwa ........................... 355/30 |

FOREIGN PATENT DOCUMENTS

| | | |
|---|---|---|
| EP | 1 075 017 A1 | 2/2001 |
| JP | WO 00/25352 | 4/2000 |
| WO | WO 00/30163 | 5/2000 |

* cited by examiner

Primary Examiner—Russell Adams
Assistant Examiner—D. Ben Esplin
(74) Attorney, Agent, or Firm—Oblon, Spivak, McClelland, Maier & Neustadt, P.C.

(57) ABSTRACT

The illuminating optical system is divided into a first portion including movable blades moving during exposure, and a second portion not containing a movable portion moving over the movable blade during exposure. The second portion is installed on the exposure main portion, and the first portion, separately from the exposure main portion. The frames configuring the first and the second optical units, the second optical unit having optical elements of a smaller movable amount than the movable amount of the movable blades, are relatively displaceably connected via the bellows-shaped member. The frames configuring the second optical units are fixed to each other via the O-ring suppressing relative displacement. As a result, the effect of vibration of the illuminating optical system during exposure on the main portion can be reduced. Upon purging nitrogen gas or the like in the space interior of the frame and the space between adjacent frames, the degree of air-tightness and chemical cleanliness is improved, consequently improving the exposure accuracy.

32 Claims, 9 Drawing Sheets

ILLUMINATING OPTICAL APPARATUS AND MAKING METHOD THEREOF, EXPOSURE APPARATUS AND MAKING METHOD THEREOF, AND DEVICE MANUFACTURING METHOD

CROSS-REFERENCE TO RELATED APPLICATION

This application is a continuation application of parent application Ser. No. 09/619,650, filed on Jul. 19, 2000 now abandoned.

BACKGROUND OF THE INVENTION

1. Field of the Invention

The present invention relates to an illuminating optical apparatus and the making method thereof, an exposure apparatus and the making method thereof, and device manufacturing method. More specifically, the invention relates to an illuminating optical apparatus suitable for application to an exposure apparatus used in a lithographic process for manufacturing semiconductor devices or liquid crystal display devices (liquid crystal devices) and the making method of the optical apparatus, an exposure apparatus comprising this illuminating optical apparatus and a making method of the exposure apparatus, and a manufacturing method of devices using this exposure apparatus in the lithographic process. The illuminating optical apparatus of the invention is suitable for illuminating an object by the use of an energy beam having a short wavelength, for example, not longer than 300 nm.

2. Description of the Related Art

When forming fine patterns on electronic devices such as semiconductor devices (such as integrated circuits) and liquid crystal displays, conventionally, the patterns to be formed were proportionally enlarged four to five times on a photomask or a reticle (hereinafter collectively referred to as a "reticle"), and then transferred onto a substrate to be exposed such as a wafer. The exposure was performed, in reduced magnification, with a reduction projection exposure apparatus such as a stepper.

With the projection exposure apparatus used for transferring such a pattern, the exposure wavelength has shifted to a smaller wavelength to cope with the tendency toward finer semiconductor integrated circuits. Currently, a wavelength of 248 nm in a KrF excimer laser is widely used, and the use of a shorter wavelength of 193 nm in an ArF excimer laser is becoming practical. Projection exposure apparatus employing a shorter wavelength of 157 nm in a $F_2$ laser and 126 nm in an $Ar_2$ laser are now being proposed.

Light with the wavelength from 120 to 200 nm is a vacuum ultraviolet light beam. Since a light flux within this wavelength band is poor in transmittance through an optical glass, materials for lenses and reticles capable of being used in a VUV exposure apparatus using vacuum ultraviolet (VUV) light for exposure are limited to crystals of fluorite, magnesium fluoride and lithium fluoride. Also, energy absorption by oxygen, water vapor or hydrocarbon gas (hereinafter from time to time referred to as "absorptive gases") is extremely large. Therefore, it becomes necessary to alter the gas in the optical path portion with a gas which energy absorption of the exposure light is smaller (low-absorptive gas) in order to exclude oxygen from the optical path.

The amount of vacuum ultraviolet light beams absorbed by oxygen gas is very large. In order to avoid absorption by oxygen, therefore, it is necessary to limit the concentration of oxygen gas in the optical path so that it does not exceed 1 ppm of the average concentration of oxygen gas in the optical path. Particularly, in the illuminating optical system where the light illuminated from the light source proceeds to the reticle through the optical system, the total distance of the optical path is long, so the concentration of oxygen is required to be limited to a smaller value than described above.

FIG. 10 schematically illustrates an example of the illuminating optical system (illuminating optical unit) which configures a conventional exposure apparatus using an excimer laser beam.

This illuminating optical system shown in FIG. 10 comprises a first fly-eye lens system 202, a folded mirror 204, a second fly-eye lens system 206, an illuminating system diaphragm plate (diaphragm revolver) 208, a first relay lens system 210, a reticle blind 212, a second relay lens system 214, a folded mirror 216, and a condenser lens 218, sequentially arranged along the optical path of the exposure light in a predetermined positional relationship. The first fly-eye lens system 202 and the illuminating system diaphragm plate 208 are rotatably-driven by actuators 220 and 222. Movable blinds configuring the first relay lens system 210 and the reticle blind 212 are driven by actuators 224 and 226, respectively in predetermined directions. Sensors S1, S2, S3 and S4 for detecting the position or displacement are respectively provided on these movable portions. In this illuminating optical system, the above-mentioned optical members, the actuators and the sensors are in general, covered with a cover 230, and the interiors were purged with nitrogen ($N_2$) gas, one of low-absorptive gases.

In this conventional illuminating optical system, the optical members configuring the illuminating optical system, the actuators, and the sensors are covered with a cover, therefore, the actuators and the sensors are located in the same space as the lenses and the mirrors. Consequently, adhesives, sealers and paints used for the actuators and the sensors, and gases emitted from these component members themselves have become the cause of chemical pollution sources of the optical devices such as lenses and mirrors.

In the above-mentioned conventional illuminating optical system, the shape of the cover has caused difficulty to completely cut off the air in the cover interior from open air outside the cover, and has allowed the chemically polluted open air containing oxygen to be mixed with the cover interior. This causes the problem of absorption of the illuminating light by the ozone generated from oxygen or photochemical reactions between oxygen and the illuminating light. Also, chemical pollution decreases the transmittance of the lenses and reflectivity of the mirrors, due to clouding substances adhered and deposited on the surfaces of the optical elements.

With an exposure apparatus, all these cases have caused a decrease in exposure accuracy resulting from a shortage in the amount of exposure light irradiated onto the wafer.

In the lithographic process for manufacturing semiconductor devices, conventionally, a stationary type exposure apparatus such as a reduction projection exposure apparatus (known as a stepper) employing a step-and-repeat method has been mainstream. However, along with the recent tendency toward a higher degree of integration of semiconductor devices and a larger wafer size, the scanning exposure apparatus employing a so-called slit scanning method and the step-and-scan method are becoming more popular. With these apparatus, a rectangular or arcuated illuminating areas on a reticle having a pattern formed are illuminated with an illuminating light, and the reticle and substrate such as a wafer are synchronously moved in a linear direction, thereby sequentially transferring the pattern onto the substrate.

With this apparatus, a movable blade (also called a "movable blind") is arranged for limiting the illuminating area on the reticle so as to avoid unnecessary exposure of a portion outside the pattern area on the reticle during exposure. This blind is a movable member, which moves during exposure. It has been arranged in the illuminating optical system, which illuminates the reticle R by an illuminating light from a light source, and is driven synchronously with the reticle during exposure (refer to Japan Patent Laid Open No. 04-196513 and the corresponding U.S. Pat. No. 5,473,410).

Semiconductor devices are formed, by depositing multiple layers of circuit patterns with respect to one another in a predetermined positional relationship onto a wafer. For this reason, in an exposure apparatus used for manufacturing semiconductor devices or the like, it is necessary to accurately overlay the patterns formed on the reticle and conduct transferring.

In the conventional scanning type exposure apparatus, however, as described above, in the illuminating optical system the movable member is arranged and moves during exposure, causing vibration in the illuminating optical system. This, in turn, causes an adverse effect on the main portion of the exposure apparatus in which the illuminating optical system is incorporated. The main portion of the exposure apparatus include a reticle stage holding the reticle R, a projection optical system projecting the pattern of the reticle R onto the wafer, and a wafer stage holding the wafer. It also includes a main portion column holding the reticle stage, projection optical system, wafer stage and the illuminating optical system, and a laser interferometer is arranged on the main portion column for measuring the positions of the both stages. The vibration described above in the illuminating optical system during exposure, especially, the residual vibration during exposure, affects the accuracy of synchronous movement between the reticle stage and the wafer stage. It also affects the positional relationship between the projection optical system and the two stages, and the values measured by the interferometer, resulting in reducing the exposure accuracy of the scanning type exposure apparatus.

If there is vibration in the illuminating optical system during exposure, the vibration similarly affects the exposure accuracy also in the stationary exposure apparatus employing the step-and-repeat method.

SUMMARY OF THE INVENTION

The present invention was developed in view of the circumstances as described above, and has a first object to provide an illuminating optical apparatus, which improves the degree of chemical cleanliness of the interior thereof.

A second object of the invention is to provide an exposure apparatus, which improves the exposure accuracy.

A third object of the invention is to provide a device manufacturing method, which improves the productivity of high-integrity microdevices.

According to a first aspect of the invention, there is provided an illuminating optical apparatus to illuminate an object with an energy beam from a light source, comprising at least one of a first optical unit which includes at least one of a drivable first optical member, and a first frame holding the first optical member, at least one of a second optical unit which has at least one of a second optical member of which a movable amount is smaller than a movable amount of the first optical member, and a second frame holding the second optical member, and a first connecting member which displaceably connects the first frame in respect to the second frame.

The expression "a movable amount smaller than the movable amount of the first optical member" is a concept covering a movable amount of null. Accordingly, the second optical unit may comprise only a non-movable optical member as the optical member.

According to the above, the frame structuring the first optical unit which has the first optical member being drivable, and the frame structuring the second optical unit which has the second optical member having a movable amount smaller than the movable amount of the first optical member, are displaceably connected via the first connecting member in respect to each other. As described above, in between frames requiring respective displacement to some extent, first connecting member suitable for the purpose is used. This improves air-tightness in the space within the frame and the space in between adjacent frames. Therefore, in the illuminating optical apparatus of the present invention, air-tightness is improved upon purging the low-absorptive gas such as nitrogen gas in the internal space of the frame and the space in between the adjacent frames, making it possible to improve the degree of chemical cleanliness in the interior space. The optical units having the frames can be easily replaced, since it is possible to separate the frames by simply removing the first connecting member.

In this case, for example, the first connecting member can be a freely expansible bellows-shaped member of which an inner surface is chemically cleaned. The chemical cleaning process may be, for example, the bellows-shaped member having an inner surface coated with fluoropolymers.

Or, the first connecting member may comprise a secondary vulcanized fluororubber. The secondary vulcanized fluororubber, which is in itself, a chemically clean material, may be used as a material for the first connecting member.

In the first illuminating optical apparatus of the present invention, a plurality of the second optical units are provided, and may further comprise a second connecting member which connects the second frame so as to suppress a displacement among the second frames. The second frames structure a part of the second optical units. In such a case, as described above, the frame configuring the first optical unit and the frame configuring the second optical unit are connected relatively displaceably via the first connecting member, while the frames configuring the second optical unit are connected (fixed) to each other via the second connecting member so as to suppress relative displacement. Frames which requiring relative displacement to some extent, and frames not requiring relative displacement are connected via different connecting members respectively suitable, thus improving air-tightness of the space interior of the frames and the space in between thereof.

In this case, for example, the second connecting member can be an O-ring which has at least a surface chemically cleaned. In this case, similar to the case above, the O-ring can comprise a resin, and can have the surface coated with fluoropolymers.

Or, the second connecting member, for example the, O-ring, may comprise a secondary vulcanized fluororubber. That is, as the material of the second connecting member, for example, the O-ring, a secondary vulcanized fluororubber, which is a chemically clean material, may be used.

Furthermore, the second connecting member may be an O-ring formed of a tube. In such a case, the O-ring becomes easily crushable by providing a larger crushing margin of the O-ring, thus improving operability of the connecting operation between frames using the O-ring.

The first illuminating optical apparatus of the present invention may further comprise an actuator which is arranged outside the first frame, and drives the first optical member held by the frame. In such a case, since the actuator is arranged outside the frame holding the drivable first optical member, the actuator is not the source of pollution for the frame and its interior, thus reducing the degree of the optical elements to be clouded by the pollution.

According to a second aspect of the invention, there is provided an illuminating optical apparatus to illuminate an object with an energy beam from a light source, comprising: a plurality of optical members arranged in a predetermined positional relationship, at least one of the plurality of optical members is a movable member; and an illuminating system housing disposed around the plurality of optical members to house the plurality of optical members to isolate the interiors thereof from the open air; an actuator which is arranged outside the illuminating system housing, and respectively drives the movable member; and a sensor which is arranged on the outside of the illuminating system housing, and measures a position or a displacement of at least one of the movable members.

With this apparatus, actuators for driving the movable members, respectively, are arranged outside the illuminating system housing containing at least a movable members, housing a plurality of optical members arranged in a predetermined positional relationship, and keeping the interiors thereof isolated from the open air in an sealed state. The actuators, therefore, are not the source of pollution for the interior of the illuminating system housing. So, in the second illuminating optical apparatus of the present invention, the degree of chemical cleanliness in the interior can be improved by purging a low-absorption gas such as nitrogen gas in the illuminating system housing, since the actuators do not act as a pollution source.

In this case, as with the actuators, the sensors are not the source of pollution in the interior of the illuminating system housing. The sensors, therefore, do not cause a decrease in the degree of chemical cleanliness in the illuminating system housing, and furthermore can control the actuators at a high accuracy based on the sensor output, allowing highly accurate positional control of the drivable optical member.

With the second illuminating optical apparatus of the invention, it is preferable that at least one of the movable members is a rotatable member which rotates around a predetermined rotation shaft, and a bearing section which supports the rotation shaft arranged in the illuminating system housing, and a magnetic fluid seal is provided between the bearing section and the rotation shaft. In this case, a magnetic liquid serving as lubricant oil enters in to a gap between the rotation shaft and the bearing. The air-tightness of the bearing section can be improved, as well as smoothing the rotation of the rotation shaft.

In this case, a fluorine contained oil may be used for the magnetic fluid seal. By using the fluorine contained oil which is a chemically clean substance, it is possible to suppress a decrease in the degree of chemical cleanliness.

According to a third aspect of the invention, there is provided an exposure apparatus for transferring a mask pattern onto a substrate, comprising an illuminating optical apparatus of the present invention, which illuminates the mask with an energy beam.

With this exposure apparatus, since the first illuminating optical apparatus of the present invention is used as an illuminating apparatus for illuminating a mask by an energy beam, it is possible to improve chemical cleanliness of the interior of the illuminating optical apparatus. This can effectively suppress the decrease in transmittance of optical elements in the illuminating optical apparatus, even when using an energy-beam for exposure having a wavelength of not longer than 300 nm. Accordingly, it is possible to prevent a decrease in the amount of exposure light irradiated onto the substrate surface, so as to achieve a highly accurate (high-resolution) exposure by the short-wave energy beam, as well as improve the throughput by shortening the exposure time.

According to a fourth aspect of the invention there is provided a second exposure apparatus of transferring a mask pattern onto a substrate, comprising a second illuminating optical apparatus which illuminates the mask with an energy beam.

With this exposure apparatus, the second illuminating optical apparatus of the present invention is used as an illuminating apparatus illuminating a mask by an energy beam. This makes it possible to improve the degree of chemical cleanliness of the interior of the illuminating optical apparatus. As a result, even when using an energy beam for exposure having a wavelength not longer than 300 nm, it is possible to effectively prevent a decrease in transmittance of the optical elements in the illuminating optical apparatus. The decrease in the amount of exposure light irradiated onto the substrate surface can also be suppressed, so as to achieve a highly accurate (high-resolution) exposure by the short-wave energy beam, as well as improve the throughput by shortening the exposure time.

According to a fifth aspect of the invention, there is provided an exposure apparatus of transferring a mask pattern onto a substrate by exposing the substrate with the energy beam via the mask, comprising: an illuminating optical system which has a first illuminating system housing which isolates a first partial optical system containing a first movable section which is movable during exposure from open air and keeps the first partial optical system in a sealed state, and a second illuminating system housing which isolates a second partial optical system physically separated from the first partial optical system containing an optical member of which the movable amount during the exposure is smaller than the movable amount of the first movable section from the open air and keeps the second partial optical system in the sealed state; and a main portion for exposure on which the second illuminating system housing is provided, including at least a substrate stage which holds the substrate exposed by the energy beam outgoing the mask; a connecting section which isolates from the open air a space between the first illuminating system housing and the second illuminating system housing and keeps the space in a sealed state, and connects the first illuminating system housing and the second illuminating system housing so as to limit the amount of vibration which travels between the two housings.

With this exposure apparatus, the illuminating optical system has a first illuminating system housing which comprises a first partial optical system with a first movable section which is movable during exposure isolated and kept sealed from the open air. The exposure apparatus also has a second illuminating system housing which comprises a second partial optical system physically separate from the first partial optical system and which has only optical members with a movable amount during exposure smaller than the movable amount of the first movable section (that is, does not contain optical members having a movable amount of over that of the first movable section), and isolates and keeps sealed. That is, the first partial optical system and the second partial optical system each have illuminating system housings to isolate the interior from the open air, so as to prevent the open air to mix with the interior and become the source of pollution. The second illuminating system housing is installed in the main portion for exposure containing at least a substrate stage holding the substrate exposed by the energy beam emitted from the mask. As a result, even when the first movable section moves largely during exposure causing vibration in the first illuminating optical system and residual vibration remains during exposure, the second partial optical system and the main portion for exposure incorporating the second partial optical system is almost free from the adverse effect of vibration. Furthermore, the connecting section connects the first illuminating system housing configuring the first partial optical system and the second illuminating system housing configuring the second partial optical system by isolating the space between them from the open air into an air-tight condition. Therefore, it is possible to prevent the open air from flowing into the space between the first illuminating system housing and the second illuminating system housing, and from becoming a pollution source. The connecting section also connects the first illuminating system housing and the second illuminating system housing while limiting the transfer of vibration between the two systems. So even if the vibration of the first illuminating system housing during exposure is transferred to the second illuminating system housing and the main portion for exposure, it hardly affects the accuracy of exposure.

According to the third exposure apparatus of the invention, therefore, it is possible to alleviate the effect of vibration of the illuminating optical system during exposure on the exposure main portion, and consequently to improve exposure accuracy.

Accordingly, the third exposure apparatus of the present invention can reduce the vibration caused by the illuminating optical system during exposure, while effectively preventing the open air to mix into the illuminating path, and as a result improving the accuracy of exposure.

In this case, the second partial optical system may comprise optical members that are stationary during the exposure, i.e., non-movable optical members, or optical members movable (displaceable) only during the non-exposure state, or the second partial optical system may include a second movable section movable in an amount smaller than that of the first movable section during exposure. Even in the latter case, vibration of the second partial optical system and the main portion of exposure during exposure is obviously reduced compared with vibration of the conventional exposure apparatus, in which residual vibration of the first partial optical system had been directly transferred to the second partial optical system and the exposure main portion.

In the third exposure apparatus of the present invention, nitrogen ($N_2$) gas or helium (He) gas having an oxygen mixture of less than a predetermined value, or preferably less than 1 ppm may be purged as a low-absorptive gas into the illuminating system housings. In such a case, it is possible to suppress absorption of the energy beam by an absorptive gas (oxygen, water vapor, hydrocarbon gas) in the first partial optical system and the second partial optical system. Accordingly, for example, an energy beam having a wavelength not longer than 300 nm (such as KrF excimer laser beam having a wavelength of 248 nm, ArF excimer laser beam having a wavelength of 193 nm, or the like) may be used. Even with the usage of such energy beams, it is possible to perform an exposure (transfer of a mask pattern onto the substrate) with high accuracy.

The third exposure apparatus of the present invention, a low-absorptive gas may be purged into the space between the first and second illuminating system housings and the interiors of the respective illuminating system housings. In such a case, the low-absorptive gas is purged in the space between the first and second illuminating system housings and the interiors of these illuminating system housings, therefore, a chemically clean state can be maintained. The energy beam can be a vacuum ultraviolet light beam, and a wavelength thereof is not longer than 200 nm (for example, $F_2$ laser beam having a wavelength of 157 nm, $Kr_2$ laser beam having a wavelength of 146 nm, or $Ar_2$ laser beam having a wavelength of 126 nm). Since it is possible to suppress absorption of the energy beam by the absorptive gas in the space between the first and second illuminating system housings and the interiors of these illuminating system housings, exposure of a higher accuracy can be performed by using an energy beam of the vacuum ultraviolet region.

In the third exposure apparatus of the invention, the connecting section which isolates the space between the first illuminating system housing and the second illuminating system housing into a sealed state, and connects the first illuminating system housing and the second illuminating system housing while limiting transfer of vibration between these housings may comprise, for example, an expansible bellows-shaped member.

In the third exposure apparatus of the invention, the first partial optical system may include: an optical integrator, and a diaphragm plate of the illuminating system having at least one of a diaphragm arranged near an emitting surface of the optical integrator, and an iris diaphragm; and the first movable section further has a switching unit which positions at least one of diaphragm and the iris diaphragm, on the emitting surface of the optical integrator.

In the third exposure apparatus of the present invention, the first movable section may be a movable blade, which limits the irradiation area on the mask during exposure with the energy beam.

According to a sixth aspect of the invention, there is provided a method of making an exposure apparatus for transferring a mask pattern onto a substrate by exposing the substrate with the energy beam via the mask, comprising: providing a main portion of exposure with a substrate stage incorporated, the substrate stage holding the substrate; providing a first illuminating system housing which isolates a first partial optical system containing a first movable section which is movable during exposure from open air and keeps the first partial optical system in a sealed state; and installing a second illuminating system housing which isolates a second partial optical system physically separated from the first partial optical system containing an optical member of which the movable amount during exposure is smaller than the movable amount of the first movable section from the open air and keeps the second partial optical system in the sealed state, to the main portion for exposure; and connecting the first illuminating system housing and the second illuminating system housing so as to limit the amount of vibration which travels between the two housings by a connecting section, and isolate from the open air a space between the first illuminating system housing and the second illuminating system housing and keeps the space in a sealed state.

According to the seventh aspect of the present invention, there is provided a making method of an illuminating optical apparatus to illuminate an object with an energy beam from a light source, which comprises: providing at least one of a first optical unit which includes at least one of a drivable first optical member; and a first frame holding the first optical member, providing at least one of a second optical unit which has at least one of a second optical member of which a movable amount is smaller than a movable amount of the first optical member, and a second frame holding the second optical member; and connecting the first frame structuring the first optical unit and the second frame structuring the second optical unit with a first connecting member which displaceably connects the first frame in respect to the second frame.

In the lithographic process, by using the first, second and third exposure apparatus of the present invention, a pattern can be formed on the substrate with high accuracy, and hence high-integrity microdevices can be manufactured at a satisfactory yield. Therefore, according to still another aspect of the invention, there is provided a device manufacturing method using any of the first to third exposure apparatuses of the invention.

DESCRIPTION OF THE PREFERRED EMBODIMENTS

Figure 1:
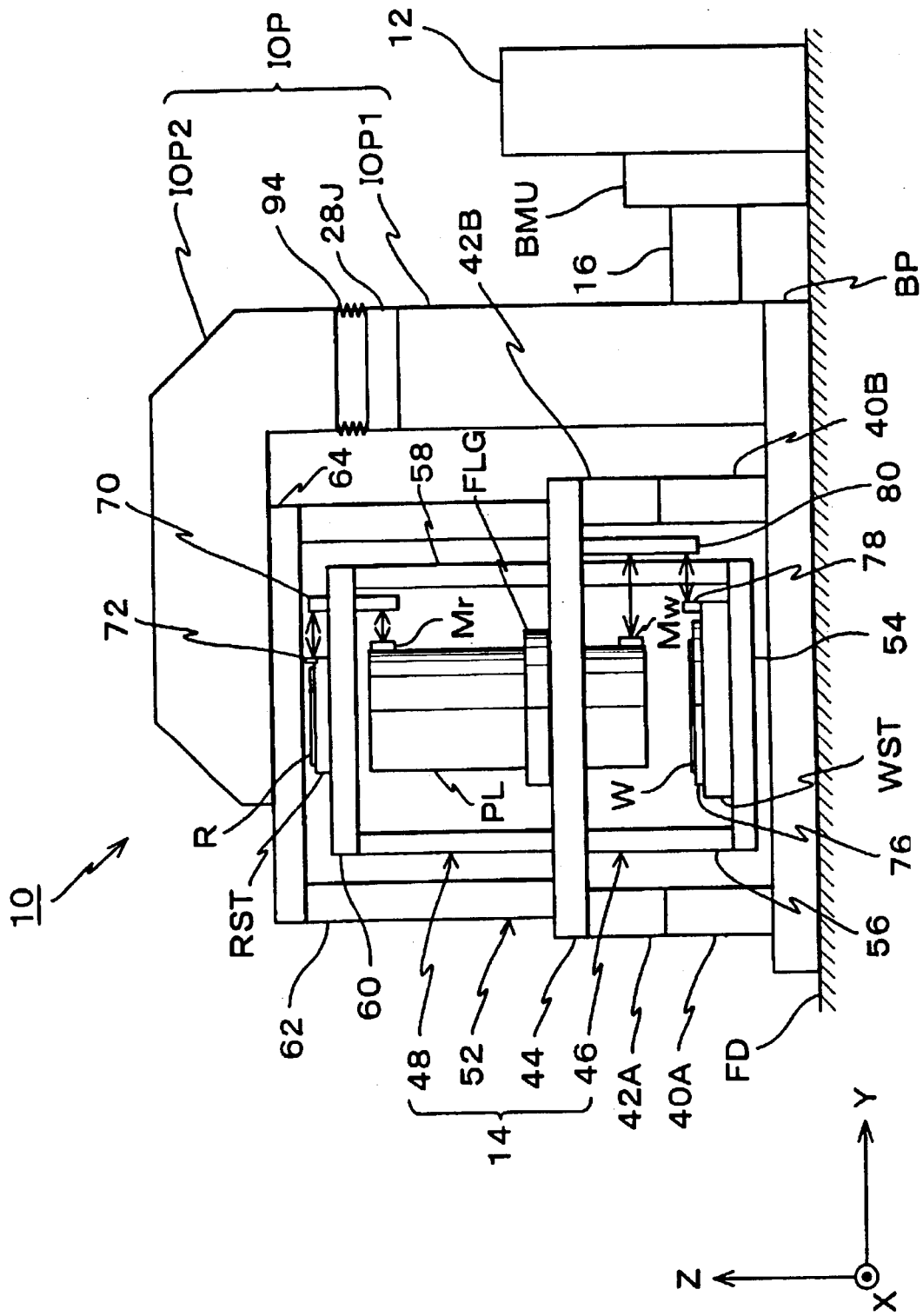
FIG. 1 is a schematic view illustrating the entire configuration of the exposure apparatus of an embodiment of the present invention.

An embodiment of the present invention will now be described with reference to FIGS. 1 to 7. FIG. 1 schematically illustrates the entire configuration of an exposure apparatus 10 in an embodiment arranged with the illuminating optical apparatus of the invention as an illuminating optical system.

The exposure apparatus 10 is a scanning type exposure apparatus which employs the step and scan method, a so-called scanning stepper, and it synchronously moves the reticle R as a mask and a wafer W as a substrate in a linear direction (in the Y direction, which is the landscape direction in FIG. 1), and transfers the circuit pattern formed on the reticle R through a projection optical system PL onto each shot area of the wafer W.

The exposure apparatus 10 comprises a light source 12, and an illuminating optical system IOP as an illuminating optical apparatus for illuminating a reticle R by an illuminating light from the light source 12. It also comprises a reticle stage RST holding the reticle R as a mask stage, the projection optical system PL projecting the illuminating light (pulse ultraviolet rays) emitted from the reticle R onto a wafer W, and a wafer stage WST holding the wafer W as a substrate stage. The exposure apparatus 10 also has a main portion column 14 which holds a portion of the illuminating optical system IOP, the reticle stage RST, the projection optical system PL and the wafer stage WST. The main portion column 14 also has a vibration isolating unit (not shown in Figs.) for suppressing or isolating vibration, and a control system which controls these units.

As the light source 12, an ArF excimer laser beam source which pulse is an ultraviolet beam having a band reduced so as to avoid an oxygen absorbing band within a wavelength range of from 192 to 194 nm is used. The main portion of this light source 12 is installed on a floor surface FD in a clean room of a semiconductor manufacturing plant. A light source controller (not shown in Figs.) is arranged with the light source 12. This light source controller controls the oscillation center wavelength and the spectral line width (half-bandwidth) of the emitted pulse ultraviolet beam, as well as control the trigger timing of the pulse oscillation and controls the gases in the laser chamber. The instructions are sent from a main controller 50 (not shown in FIG. 1; see FIG. 7).

As the light source 12, a KrF excimer laser light source using a pulse ultraviolet beam having a wavelength of 248 nm, or an $F_2$ laser light source using a pulse ultraviolet beam having a wavelength of 157 nm can be used. The light source 12 can be arranged in a separate room (service room) having a lower degree of cleanliness than that of the clean room, or in a utility space provided beneath the floor of the clean room.

The light source 12, which is not shown in FIG. 1 for the convenience of drawing, is actually connected to an end (incident end) of a beam-matching unit BMU via bellows and pipes that shield light. The other end (outgoing end) of the beam-matching unit BMU is connected to a first partial illuminating optical system IOP1, which will be described later, of the illuminating optical system IOP via a pipe 16 which incorporates a relay optical system.

Figure 2:
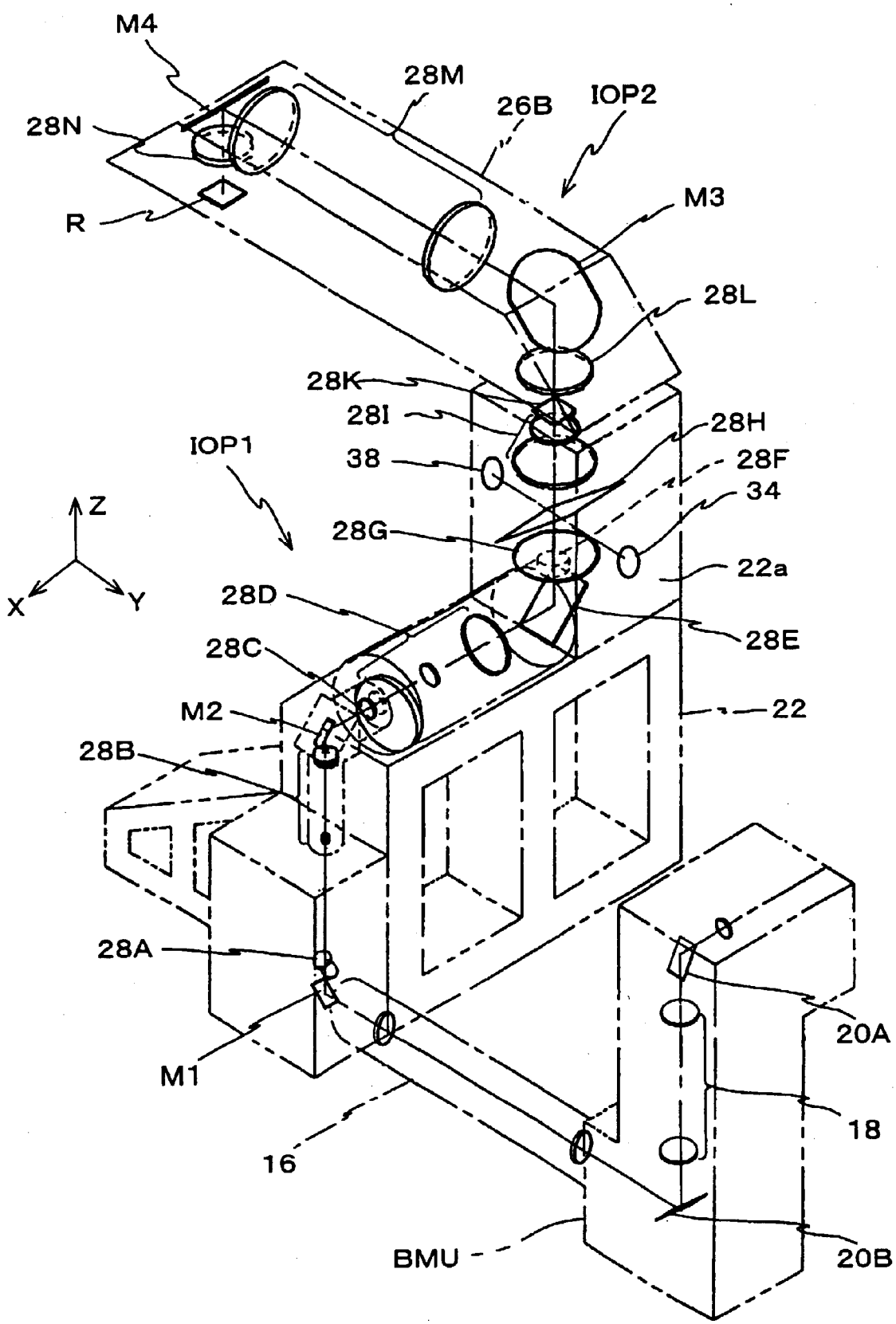
FIG. 2 illustrates a concrete configuration of the illuminating optical system shown in FIG. 1.

The beam-matching unit BMU, as is shown in FIG. 2, has a relay optical system 18 and a plurality of movable reflectors 20A and 20B. The main controller 50 performs positional matching of the optical path of the pulse ultraviolet beam (ArE excimer laser beam) having a reduced band, which proceeds from the light source 12 to the first partial illuminating optical system IOP1 described below, based on these movable reflectors 20A and 20B.

The illuminating optical system IOP is configured from two portions; a first partial illuminating optical system IOP1 as a first partial optical system and second partial illuminating optical system IOP2 as a second partial optical system. A portion of the first partial optical system IOP1, as will be described later, is incorporated in a separate pedestal 22 (not shown in FIG. 1; see FIG. 2). This pedestal 22 is installed on a base plate BP which is called a frame caster and is a reference for an apparatus arranged horizontally on the floor surface FD, and the remaining portion of the first partial optical system is held by the pedestal. The second partial illuminating optical system IOP2 is supported from below, as shown in FIG. 1, by a second supporting column which configures the main portion column 14, as will be described later.

The configuration of the illuminating optical system IOP will now be described respectively, with reference to FIG. 2.

As shown in FIG. 2, the first partial illuminating optical system IOP1 comprises the following units arranged in a predetermined positional relationship inside or on the upper surface of the separation pedestal 22; a mirror M1, a variable beam attenuator 28A, a beam forming optical system 28B, a mirror M2, a first fly-eye lens system 28C as an optical integrator, a condenser optical system 28D, a vibration mirror 28E, a second fly-eye lens system 28F as an optical integrator, an illuminating system aperture diaphragm plate 28G, a beam splitter 28H, a first relay lens system 28I, and a movable reticle blind 28J as a movable field diaphragm structuring a reticle blind mechanism (not shown in FIG. 2; see FIG. 1) arranged.

The second partial illuminating optical system IOP2 comprises; an illuminating system housing 26B as a second illuminating system housing, a fixed reticle blind 28K housed in the illuminating system housing 26B in a predetermined positional relationship, a lens 28L, a mirror M3, a second relay lens system 28M, a mirror M4 and a main condenser lens 28N.

Following is a more detailed description of the units which structure the illuminating optical system IOP as mentioned above.

The variable beam attenuator 28A is to adjust the average energy by pulse of each pulse ultraviolet beam. A plurality of ND filters having different beam attenuating ratios are arranged at predetermined angular intervals on a rotatable disk (turret) in this case, so that the beam attenuating ratio can be changed sequentially by adjusting the rotation angle of the disk. The rotation plate structuring the variable beam attenuator 28A is driven by a driving mechanism 29 including a motor (not shown in FIG. 1; see FIG. 7) controlled by an illuminating controller 30 (not shown in FIG. 1; see FIG. 7) which is controlled by the main controller 50. A variable beam attenuator in which the beam attenuation ratio is continuously variable by adjusting the overlapping degree of two optical filters which transmittance continuously varies, can be employed.

The beam forming optical system 28B adjusts the sectional shape of a pulse ultraviolet beam controlled to a predetermined peak intensity by the variable beam attenuator 28A, so that it becomes identical to the general shape of the incident end of the first fly-eye lens system 28C. This improves the incident efficiency of the pulse ultraviolet beam into the first fly-eye lens 28, and the lens system 28C which structures the incident end of a double fly-eye lens system and will be described later, is arranged behind the optical path. In this case, it is structured by a two-group zoom optical system including a cylinder lens and a beam expander.

The double fly-eye lens system functions to uniform the intensity distribution of the illuminating light. It is configured of the first fly-eye lens system 28C which is sequentially arranged on the optical path of the pulse ultraviolet beam behind the beam forming optical system 28B, the condenser lens system 28D, and the second fly-eye lens system 28F.

As the first fly-eye lens system 28C, a turret having fly-eye lenses arranged on a rotatable disk is employed in this case. By rotating the disk, therefore, the fly-eye lenses can be accurately positioned on the optical path of the pulse ultraviolet beam.

The condenser lens system 28D is for collecting beams from a planar light source (a plurality of point light sources) formed at the emitting end of the first fly-eye lens system 28C, as will be described later. It also ensures that the beams proceed to the second fly-eye lens system 28F, which is the latter half of the process, without losing any intensity. In this case, a three-group optical system of the mechanical correction method based on the zoom cam mechanism, which has three convex or positive lenses and changes the focal distance continuously while maintaining the image forming position on the same plane, is employed. The driving principle and other details of the movable lens configuring the condenser lens system 28D will be described later, in detail.

In between the condenser lens system 28D and the second fly-eye lens system 28F, a vibrating mirror 28E for smoothing interference fringes or tiny speckles caused on the irradiated surface (reticle surface or wafer surface) is arranged. Vibration of the vibrating mirror 28E (deflection angle) is controlled by the illumination control unit 30, which is controlled by the main controller 50 via a driving system not shown in Figs. A similar structure with a combination of a double fly-eye lens system and a vibrating mirror as in this embodiment, is disclosed in detail in Japan Patent Laid Open No. 01-259533 and in the corresponding U.S. Pat. No. 5,307,207, which are fully incorporated by reference herein.

An illuminating system aperture diaphragm plate 28G made from a disk-shaped member, is arranged near the emitting surface of the second fly-eye lens system 28F. On this illuminating system aperture diaphragm plate 28G, a plurality of aperture diaphragm is arranged at substantially equal angular intervals. The aperture diaphragm may have a circular aperture of which shape is ordinary, or it may have a small circular aperture for reducing the σ-value, which is a coherence factor. It may also have a ring-shaped aperture for ring-shaped illumination, or a plurality of apertures (for example, four apertures) of which each central position differ from the optical axis position for modified illumination. The illuminating system aperture diaphragm plate 28G, is rotatably driven by a motor 32 (not shown in FIG. 2; see FIG. 7) controlled by the illumination control unit 30, and the aperture diaphragm are controlled to be positioned on the emitting surface of the second fly-eye lens system 28F. That is, in this embodiment, a switching unit is configured to position the preferred aperture diaphragms on the illuminating system aperture diaphragm plates 28G at the emitting surface of the optical integrator by the motor 32.

The beam splitter 28H, which have a large transmittance and a small reflectance is arranged downstream of the illuminating system aperture diaphragm plate 28G on the optical path of the pulse ultraviolet beam. Further downstream the optical path, the first relay lens system 28I and the movable reticle blind 28J (not shown in FIG. 2; see FIG. 1) are sequentially arranged.

The movable reticle blind 28J has, for example, two L-shaped movable blades, and an actuator for driving these movable blades. In this embodiment, the two movable blades form a first movable section. The position of the two blades vary, in respect to the scanning direction of the reticle R and the non-scanning direction that is perpendicular to the scanning direction. By the usage of the movable reticle blind 28J, the illuminating area on the reticle R which is determined by the fixed reticle blind 28K as described later, can be further limited upon starting and ending of scanning exposure, to prevent exposure of unnecessary portions. The main controller 50 controls the movable reticle blind 28J.

On the reflection optical path from the light source 12 side of the beam splitter 28H, an integrator sensor 34 made of a photoelectric conversion element is arranged. A reflected beam monitor 38 is arranged on the reflection optical path from the reticle R side of the beam splitter 28H, and it is identical with the integrator sensor 34 made of a photoelectric conversion.

The above-mentioned reticle blind 28K is arranged on a surface slightly defocussed from the conjugate plane relative to the pattern surface of the reticle R near the incident end of the illuminating system housing 26B. An opening of a predetermined shape is formed, so as to determine the illuminating area on the reticle R. The predetermined shape, is formed in a slit extending linearly in the x-axis direction perpendicular to the moving direction of the reticle R (y-axis direction) upon scanning exposure in the center of a circular field view of the projection optical system PL or in a rectangular shape.

The arrangement surface of the fixed reticle blind 28K is slightly defocussed from the conjugate plane relative to the pattern surface of the reticle R, so as to unify the amount of exposure in each illuminating area upon scanning exposure. This is applicable mainly for scanning exposure apparatus, in particular for an apparatus using a pulse beam as the illuminating light for exposure. With this apparatus, the illuminance distribution of the pulse beam relative to the scanning direction within the illuminating area on the reticle (wafer) is shaped in a trapezoid (having slopes at the both ends).

The second relay lens system 28M housed in the illuminating system housing 26B configures the relay optical system, together with the first relay lens system 28I. On the optical path of the pulse ultraviolet beam downstream of this second relay lens system 28M, a mirror M4 reflecting the pulse ultraviolet beam which has passed through the second relay lens system 28M toward the reticle R is arranged. Further downstream of the mirror M4 on the optical path of the pulse ultraviolet beam, a main condenser lens system 28N is arranged. When at least one of the relay lens system 28M, the lens 28L and the mirror M4 housed in the illuminating system housing 26B is not performing exposure, the optical axis thereof is movable in respect to the optical axis of the others, lens or mirror.

As described above, the incident surface of the first fly-eye lens system 28C, the incident surface of the second fly-eye lens system 28F, the arrangement surface of the blade of the movable reticle blind 28J, and the pattern surface of the reticle R are arranged optically conjugated with each other. The light source surface formed on the emitting side of the first fly-eye lens system 28C, the light source surface formed on the emitting side of the second fly-eye lens system 28F, and the Fourier transform surface of the projection optical system PL (exit pupil surface) are arranged optically conjugated with each other. Consequently, these form a Koehler illumination system.

Operation of the illuminating optical system IOP having the above-mentioned configuration, i.e., the first partial illuminating optical system IOP1 and the second partial illuminating optical system IOP2 will now be briefly described. When the pulse ultraviolet beam from the light source 12 enters horizontally into the first partial illuminating optical system IOP1 via the beam matching unit BMU and the relay optical system, the optical path of the pulse ultraviolet beam is deflected by the mirror M1 perpendicularly upward. The deflected beam enters the variable beam attenuator 28A, and is adjusted to a predetermined peak intensity by the ND filter of the variable beam attenuator 28A before entering the beam form optical system 28B. The pulse ultraviolet beam shape is adjusted in the beam forming optical system 28B, so as to efficiently enter the first fly-eye lens system 28C which is arranged further downstream of the optical path. Then, when the pulse ultraviolet beam enters the first fly-eye lens system 28C via the mirror M2, a planar light source, i.e., a secondary light source comprising many light source images (point light sources) is formed on the emitting side of the first fly-eye lens system 28C. The pulse ultraviolet beam released from each of these multiple point light sources enters the second fly-eye lens system 28F via the condenser lens system 28D and the vibrating mirror 28E which reduces speckles caused by coherence of the light source. As a result, a tertiary light source is formed in which multiple light source images are uniformly distributed within an area of a predetermined shape at the emitting end of the second fly-eye lens system 28F. The pulse ultraviolet beam emitted from this tertiary light source passes through one of the aperture diaphragms on the illuminating system aperture diaphragms plate 28G, and then reaches the beam splitter 28H which has a large transmittance and a small reflectivity.

Most of the pulse ultraviolet beam (for example about 97%) passes through the beam splitter 28H, and the remaining portion (for example, about 3%) is reflected. The pulse ultraviolet beam serving as an exposure light which has passed through the beam splitter 28H, passes through the first relay lens system 28I and the opening of the blade of the movable reticle blind 28K. The beam, then, illuminates the opening of the fixed reticle blind 28K with a uniform intensity distribution.

The pulse ultraviolet beam, which passes through the opening of the fixed reticle blind 28K, then reaches the mirror M3 via the lens 28L where the optical path is deflected horizontally. The pulse ultraviolet beam continues through the second relay lens system 28M, and the mirror M4 bends the optical path perpendicularly downward so that the beam proceeds through the main condenser lens system 28N to illuminate a predetermined illuminating area (a slit-shaped or rectangular illuminating area extending linearly in the x-axis direction) on the reticle R. The reticle R is held on the reticle stage RST, and is illuminated with a uniform illuminance distribution. The illuminating light irradiated onto the reticle R is rectangular shaped, and extends in a long and narrow shape in the x-axis direction (non-scanning direction) at the center of the circular projection view of the projection optical system PL shown in FIG. 1. The width of the illuminating light in the y-axis direction (scanning direction) is set substantially uniform.

The remaining pulse ultraviolet beam reflected at the beam splitter 28H, enter an integrator sensor 34, where it is converted photo-electrically. A photoelectric conversion signal by the integrator sensor 34 is sent to the main controller 50, via a peak hold circuit and an A/D converter not shown in Figs. An applicable integrator sensor 34 can be, for example, a PIN-type photodiode which has sensitivity in the vacuum ultraviolet region, and a quick response time for detecting the emitted pulse beam of the light source 12. A correlation coefficient between the integrator sensor 34 output and the illuminance (amount of exposure) of the pulse ultraviolet beam on the wafer W surface is predetermined, and stored in the memory in the main controller 50.

The reflected beam from the pattern surface of the reticle R proceeds sequentially from the main condenser lens system 28N to the mirror M4, and then the second relay lens system 28M to the mirror M3. The beam then goes onto the lens 28L, the opening of the fixed reticle blind 28K, the blade opening of the movable reticle blind 28J, and then proceeds to the first relay lens system 28I. It is then reflected on the beam splitter 28H, and enters a reflected light monitor 38, where it is photo-electrically converted. A photo-electric conversion signal from the reflected light monitor 38 is sent to the main controller 50 via the peak hold circuit and an A/D converter and the like not shown in Figs. The reflected light monitor 38 is used, for example, when measuring the transmittance of the reticle R.

Frames holding the optical members forming the illuminating optical system IOP and the connecting structure between these frames will be described later in detail, since they are the biggest features in this embodiment.

Referring again to FIG. 1, the main portion column 14 comprises a barrel supporting bed 44. This bed 44 is substantially horizontally supported via a plurality (four in this case) supporting members 40A to 40D (struts 40C and 40D in the depth on the drawing paper are not shown)) arranged on the base plate BP. Vibration isolating units 42A to 42D are fixed on top of these supporting members 40A to 40D (vibration isolating units 42C and 42D in the depth on the drawing paper in FIG. 1 are not shown; see FIG. 7). A suspended column 46 is suspended down from the lower surface of the bed 44, and a first and second supporting columns 48 and 52 are provided on the bed 44.

The vibration isolating units 42A to 42D are arranged in series (or in parallel) on top of the supporting members 40A to 40D, and is structured of an air mount of which the inner pressure is adjustable, and a voice coil motor. The vibration isolating units 42A to 42D isolate subtle vibration travelling from the floor surface FD to the bed 44 via the base plate BP and the supporting members 40A to 40D at a micro-G level.

The bed 44 is made of a casting or the like has an opening circular in a plan view formed at the center, and within the opening, the projection optical system PL which optical axis direction is the Z-axis direction is inserted from above. On the outer periphery of the barrel portion of the projection optical system PL, a flange FLG connected integrally with the barrel portion is provided. For this flange FLG, a material having a low thermal expansion coefficient such as Inver (a low-expansion alloy comprising iron containing 36% nickel, 0.25% manganese and trace carbon and other elements) is used, and the flange FLG structures a so-called kinematic supporting mount. This mount supports the projection optical system PL via three points, which are a point, a plane, and a V groove in respect to the bed 44. Employing such a kinematic supporting structure provides advantages such as simplifying the assembly of the projection optical system PL into the bed 44. And, the stress caused after assembly by the vibration of the bed 44 and the projection optical system PL, a temperature change, and a change in posture can be most effectively reduced.

The suspended column 46 comprises a wafer base bed 54 for a wafer and four suspending members 56 suspending and supporting the wafer base bed 54 almost horizontally.

The first supporting column 48 has four legs 58 (legs in the depth of the drawing paper are not shown in Figs.) planted around the projection optical system PL on the upper surface of the bed 44. The column 48 also comprises a reticle base bed 60 for a reticle, which is supported almost horizontally by the four legs 58.

Identically, the second supporting column 52 is configured of four struts 62 (struts in the depth of the drawing paper are not shown) planted around the first supporting column 48 on the upper surface of the bed 44. It also has a ceiling plate 64, which is supported almost horizontally by these four struts 62. The ceiling plate 64, which is supported by the second supporting column 52, in turn, supports the second partial optical system IOP2 described earlier.

On the bed 44 structuring the main column 14, in actual, three vibration sensors to measure vibration in the Z direction of the main column 14 (for example, accelerometers) are arranged. Three vibration sensors such as accelerometers to measure vibration in the XY plane direction (for example, two vibration sensors measure vibration of the main portion column 14 in the Y direction, and the remaining vibration sensor measures vibration of the main portion column 14 in the X direction) are also arranged on the bed 44. The sensors are omitted in FIG. 1. In the following paragraphs, these six vibration sensors will be collectively referred to as the vibration sensor group 66. Measured values of the vibration sensor group 66 are sent to the main controller 50 (see FIG. 7). The main controller 50 can therefore determine vibration of the main portion column 14 in directions of six degrees of freedom, on the basis of the measured values of the vibration sensor group 66. It is thus possible for the main controller 50 to effectively suppress vibration of the main portion column 14 when, for example, the reticle stage RST and the wafer stage WST is moving. The vibration is suppressed when the main controller 50 performs, for example, feedback control, or feedback control and feedforward control, and controls the speed of the vibration isolating units 42A to 42D. This removes vibration of the main portion column 14 in the directions in six degrees of freedom, the vibration being calculated according to the measured values of the vibration sensor group 66.

The reticle stage RST is arranged on the reticle base bed 60 for a reticle, which configures the first supporting column 48 forming the main portion column 14. The reticle stage RST is driven by, for example, a reticle stage driving system 68 (not shown in FIG. 1; see FIG. 7) which comprises a magnetic levitation type two-dimensional linear actuator. It is structured to allow the reticle R to be linearly driven with large strokes in the Y-axis direction on the reticle base bed 60, and can also be finely driven in the X-axis direction and the θz direction (rotating direction around the Z axis).

As a part of the reticle stage RST, a mirror 72 reflecting length-measuring beam from a reticle laser interferometer 70 serving as a position detector for measuring the position or the amount of movement is arranged. The reticle laser interferometer 70 is fixed to the reticle base bed 60. It detects the position of the reticle stage RST within the XY plane (including θz rotation) with a resolution of, for example, 0.5 to 1 nm, with reference to a fixed mirror Mr fixed to the upper side surface of the projection optical system PL.

Figure 7:
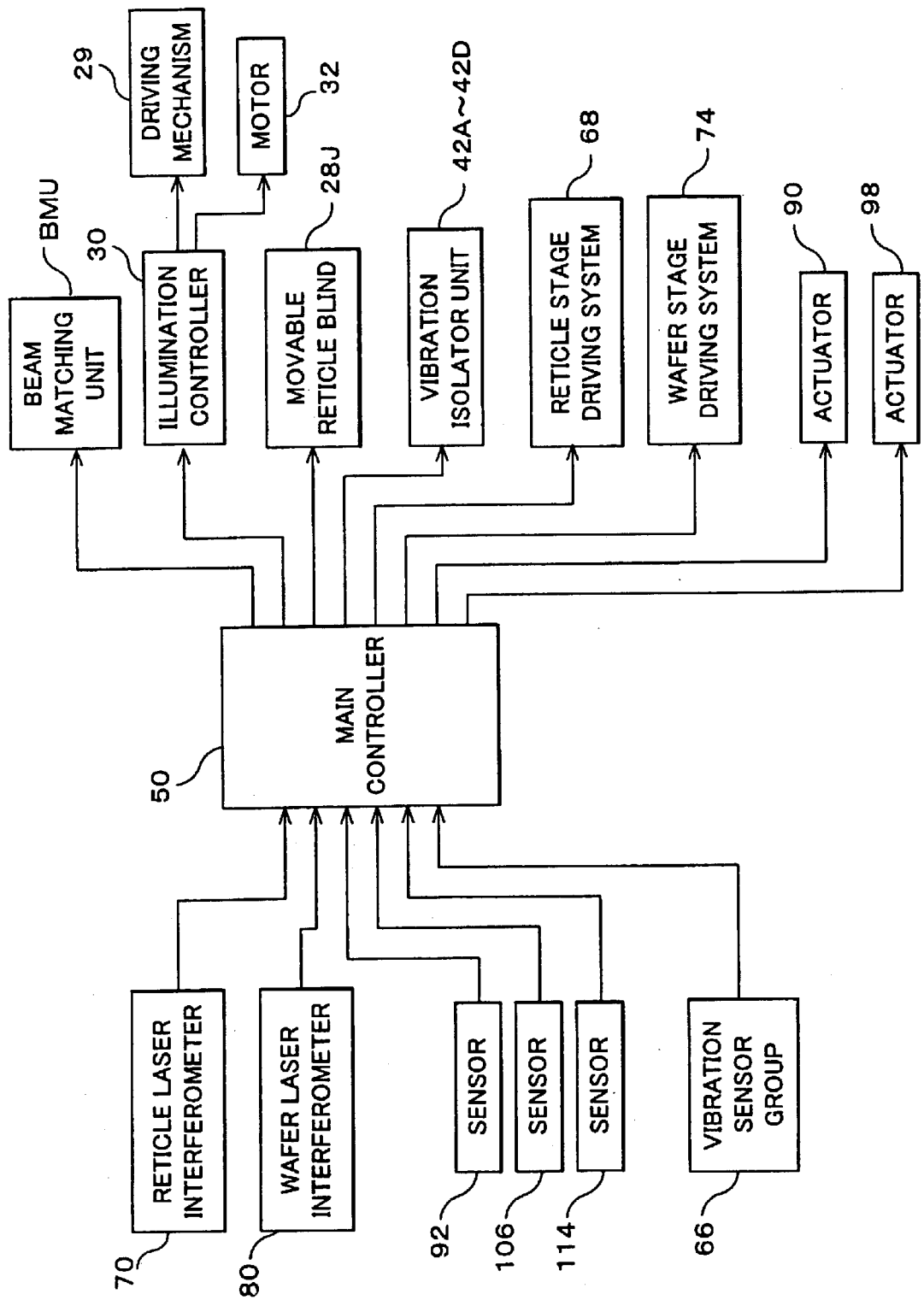
FIG. 7 is a block diagram illustrating the configuration of the control system of the apparatus shown in FIG. 1.

The positional information (or speed information) of the reticle stage RST (i.e., the reticle R) measured by the reticle laser interferometer 70 is sent to the main controller 50 (see FIG. 7). Basically, the main controller 50 controls the reticle stage driving system 68, so that the positional information (or speed information) output by the reticle interferometer 70 coincide with the instructed values (a target position, or a target speed).

In this configuration, as the projection optical system PL, a refractive optical system with a reduction magnification of ¼, ⅕ or ⅙ is employed. The refractive optical system is structured of only refractive optical elements (lens elements)

made of quartz or fluorite as optical material, and is double telecentric on the objective (reticle R) side and the image (wafer W) side, with a circular projecting view. Therefore, when a pulse ultraviolet beam is irradiated onto the reticle R, an image forming light flux from portions of the circuit pattern areas on the reticle R which is illuminated by the pulse ultraviolet beam enter the projection optical system PL. And upon each pulse irradiation of the pulse ultraviolet beam, a partial inverted image of the circuit pattern is formed at the center of the circular view on the image forming side of the projection optical system PL, the image being limited to a slit or rectangular (polygonal) shape. Thus, the partial inverted image of the projected circuit pattern is transferred on a resist layer in a reduced size, the resist layer located in a shot area among a plurality of shot areas on the wafer W arranged on the image forming plane of the projection optical system PL.

The wafer stage WST is arranged on the wafer base bed 54 for a wafer, which configures the suspended column 46. It is freely drivable within the XY plane by a wafer stage driving system 74 (not shown in FIG. 1; see FIG. 7) structured from, for example, a magnetic levitation type two-dimensional linear actuator and the like.

The wafer W is fixed onto the upper surface of the wafer stage WST by vacuum chucking via the wafer holder 76. The XY position and the amount of rotation (amount of yawing, amount of rolling and amount of pitching) of the wafer stage WST, are measured real time with a predetermined resolution of, for example, 0.5 to 1 nm by means of a wafer laser interferometer 80. The laser interferometer 80 measures a change in position of a mirror 78 arranged on a portion of the wafer stage WST in respect to a reference mirror Mw fixed to the lower end of the barrel of the projection optical system PL. The measured values of the wafer laser interferometer 80 are sent to the main controller 50 (see FIG. 7).

In the exposure apparatus 10 of this embodiment, the main portion of the exposure apparatus is configured by the main portion column 14 described above, as well as the reticle stage RST being supported by the main portion column 14, the wafer stage WST, and the projection optical system PL.

Next, the frame holding each optical members of the first and second partial illuminating optical systems IOP1 and IOP2 that configures the illuminating optical system IOP, and the connecting structure thereof will be described in detail with reference to FIGS. 3 and 4.

Figure 3:
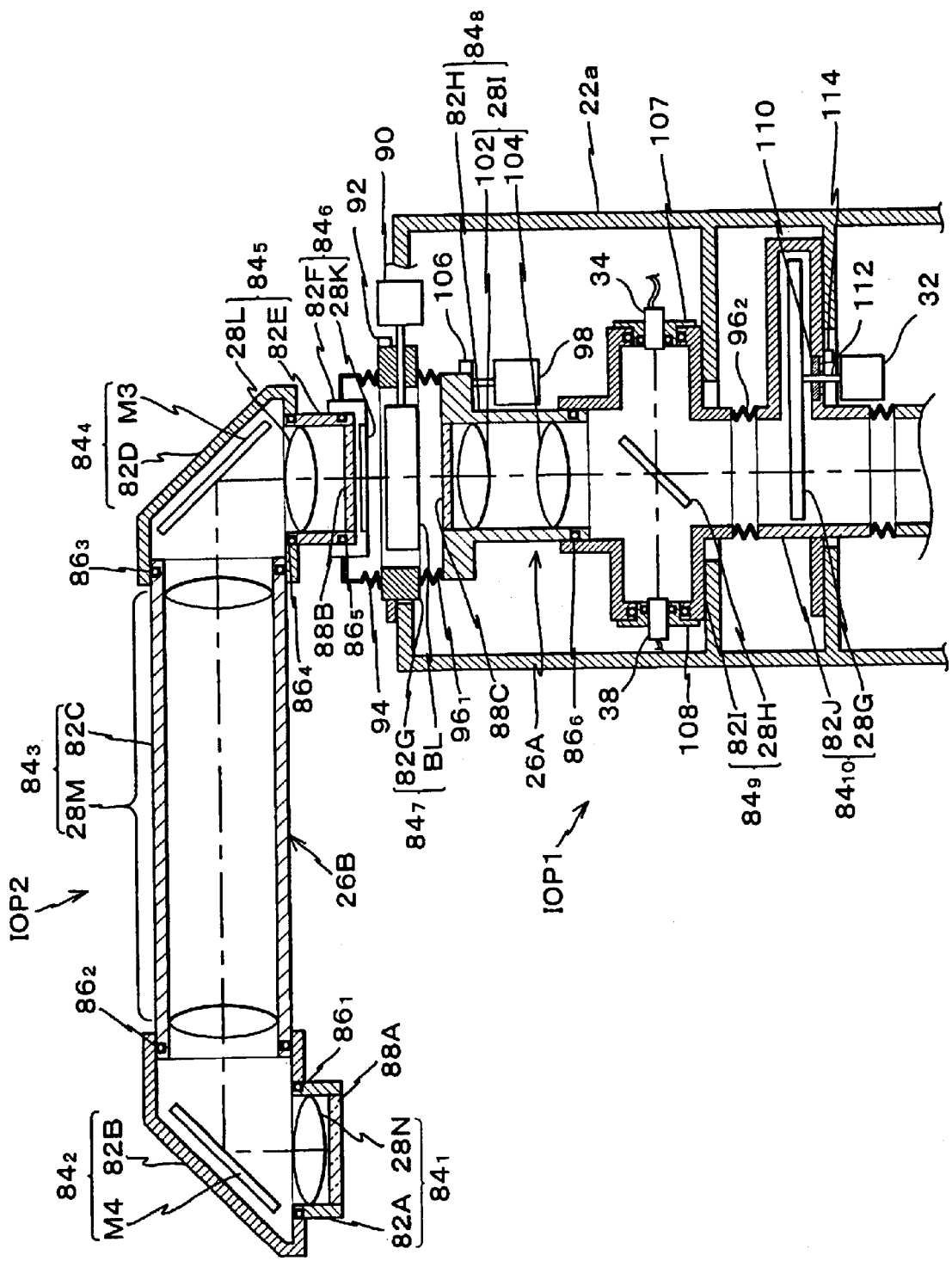
FIG. 3 is a sectional view of frames holding the individual optical members, showing the general view of the second partial illuminating optical system IOP2 configuring the illuminating optical system in FIG. 2, and a partial view of the first partial illuminating optical system IOP1.

FIG. 3 is a sectional view of the second partial illuminating optical system IOP2 in general and a portion of the first partial illuminating optical system IOP1. As is obvious from FIG. 3, the illuminating optical system IOP is structured of a plurality of optical units. The optical units each have at least one optical member (an optical element such as a lens or a mirror, or a diaphragm or blade of the reticle blind) and a frame to hold the optical element.

More specifically, the second partial illuminating optical system IOP2 comprises the following units sequentially connected, as shown in FIG. 3. A main condenser lens 28N and a frame 82A holding the lens 28N, configuring an optical unit $84_1$; a mirror M4 and a frame 82B holding the mirror M4, configuring an optical unit $84_2$; a second relay lens system 28M and a frame 82C holding the second relay lens system 28M, configuring an optical unit $84_3$; a mirror M3 and a frame 82D holding the mirror M3, configuring an optical unit $84_4$; a lens 28L and a frame 82E for holding the lens 28L, configuring an optical unit $84_5$; and a fixed reticle blind 28K and a frame 82F holding the fixed reticle blind 28K, configuring an optical unit $84_6$.

The optical units $84_1$ to $84_6$ configuring the second partial illuminating optical system IOP2 are second optical units in which optical members held by the respective frames are optical elements such as a non-movable lens or mirror, or a non-movable fixed reticle blind (field stop). Once the positional relationship between these lenses and mirrors are set in a predetermined position, subsequent adjustment is not necessary, while it is possible to set the positional relationship at a sufficient accuracy. The frames configuring adjacent optical units are respectively connected with relative movements limited, via O-rings $86_1$, $86_2$, $86_3$, $86_4$ and $86_5$, serving as second connecting members.

Figure 4A:
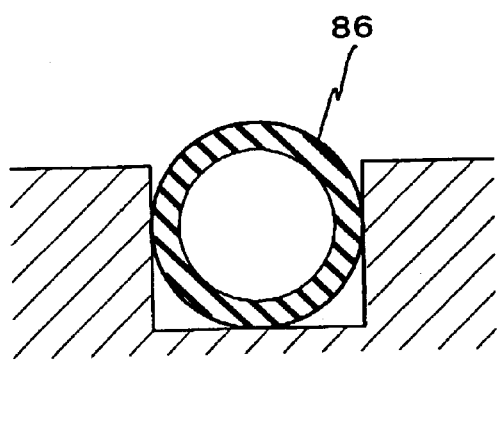
FIG. 4A illustrates a sectional shape of the O-ring used in the illuminating optical system shown in FIG. 3.
Figure 4B:
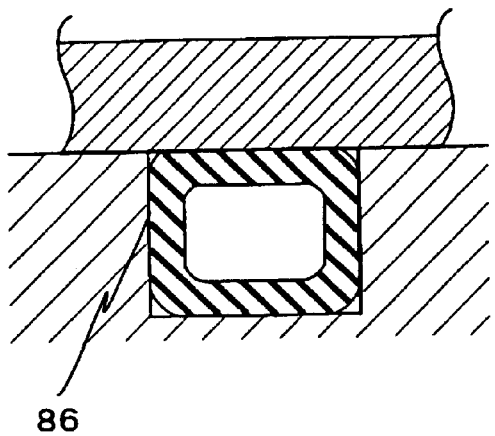
FIG. 4B illustrates a pressured O-ring shown in FIG. 4A.
Figure 5A:
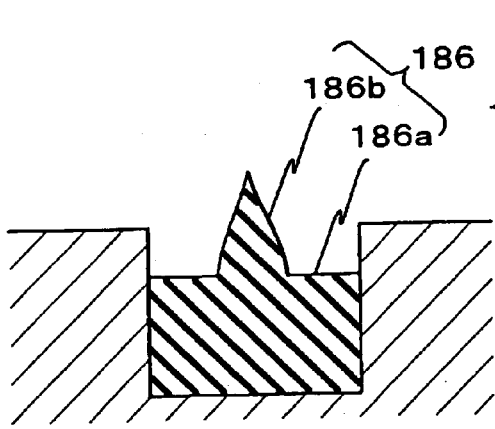
FIG. 5A illustrates the sectional shape of a modified example of the O-ring.
Figure 5B:
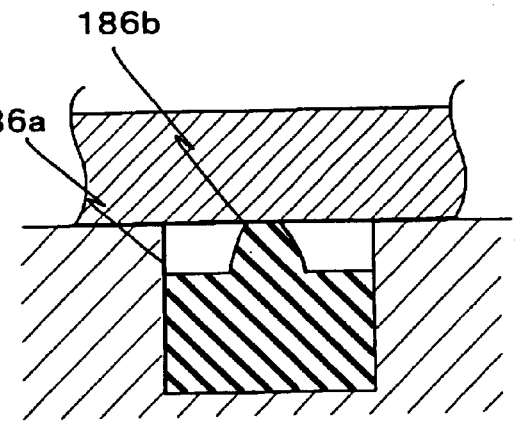
FIG. 5B illustrates a pressured O-ring shown in FIG. 5A.

As O-rings $86_1$ to $86_5$, in this embodiment, they are made of fluororubber each having a hollow sectional shape and are secondary vulcanized for about 24 hours at about 240° C. are used as. The O-rings are of a tube-like shape so that an increased crushing margin facilitates crushing operation as shown in FIG. 4B, thereby improving operability of connection between the frames using the O-rings. Therefore, the shape is not limited to a tube-like shape, but other shapes may be used as long as it allows an increased crushing margin. For example, an O-ring having the sectional shape as shown in FIG. 5A which has a base portion 186*a* to be fitted into the groove of the frame, and a projected portion 186*b* which projects from the base portion 186*a* becoming finer at the tip may be used. This makes crushing easy, as shown in FIG. 5B. A secondary vulcanized fluororubber is used, because the fluororubber which is originally a chemically clean material, becomes a cleaner material with a smaller amount of degassing since impurities are removed during the secondary vulcanizing process. Chemically cleaned O-rings coated with fluoropolymers on the surface may be used as the O-rings $86_1$ to $86_5$.

The inner surfaces of the frame 82A, 82B, 82C, 82D, 82E and 82F are chemically cleaned, by coating of a fluoropolymers or by forming a film (a ceramics film or a metal film made of stainless steel) with plasma flame coating. As an alternative, a chemically clean material such as stainless steel or teflon can be used for these frames 82A to 82F. All the O-rings and frames described hereafter are also formed in the same manner described above.

An illuminating system housing 26B is formed, resulting from sequential connection of the frames 82A, 82B, 82C, 82D, 82E and 82F as described above. Cover glass plates 88A and 88B are respectively attached to the frames 82A and 82E located at the both ends (emitting end and incident end) of the illuminating system housing 26B, to prevent contact of the main condenser lens 28N and the lens 28L with the air.

The first partial illuminating optical system IOP1 is configured by sequentially connecting two L-shaped movable blades BL (first movable section) and a frame 82G holding the blades BL structuring an optical unit $84_7$, a first relay lens system 28I and frame 82H holding the lens system 28I structuring an optical unit $84_8$, a beam splitter 28H and a frame 82I holding the beam splitter 28H structuring an optical unit $84_9$, an illuminating system aperture diaphragm plate 28G and a frame 82J holding the diaphragm plate 28G structuring an optical unit $84_{10}$, and many other optical units.

The frame 82G structuring the optical unit $84_7$ holds the movable blade BL having a large movable amount as an optical member. This movable blade BL is driven by an actuator 90 arranged outside the frame 82G. In this case, the two movable blades BL and the actuator 90 form the movable reticle blind 28J mentioned earlier. For example, a linear motor having a mover supported in a non-contact manner by an air-bearing relative to the guide face is used as the actuator 90. By using such an actuator, it is possible to improve the degree of cleanliness and chemical cleanliness compared with the case of driving the movable blades via a ball screw mechanism by using a rotary motor. That is, non-contact driving by the actuator reduces the dust production compared with contact driving by a linear guide, and a ball screw and a motor bearing are not required, eliminating the degassing process, thus improving the degree of chemical cleanliness.

Outside the frame 82G, a sensor 92 is arranged for detecting the amount of driving of the blades BL by the actuator 90. Output of this sensor 92 is sent to the main controller 50 (see FIG. 7), and the main controller 50 controls the actuator 90 based on the output of the sensor 92 upon scanning exposure, and synchronously moves the blades BL and the reticle R. Therefore, exposure of an unnecessary portion is prevented.

Connection of the frame 82F and the frame 82G, i.e., connection between the second partial illuminating optical system IOP2 and the first partial illuminating optical system IOP1 will now be described.

In the case the frame 82F and the frame 82G are firmly connected, vibration caused by the movable blades BL being driven during exposure affecting the frame 82G is directly transferred to the frame 82F side, i.e., on the side of the second partial illuminating optical system IOP2 held by the main portion column 14, which is not a preferable state. In this embodiment, therefore, the frame 82F and the frame 82G are made displaceable in respect to each other. They are connected via an expansible bellows-shaped member 94 serving as a connecting member capable of keeping the interior thereof in an air tight condition, so that the vibration transferred between them is limited.

As the material for the bellows-shaped member 94, a fluororubber secondary vulcanized under the same conditions as the O-ring mentioned above is used.

Identically, the frame 82G and the frame 82H holding the first relay lens system 28I are connected via an expansible bellows-shaped member $96_1$ made of a secondary vulcanized fluororubber, as with the case of the bellows-shaped member 94. For the bellows-shaped members 94 and $96_1$, a material having at least the inner surface chemically cleansed such as fluoropolymers coating, may be employed. Metal such as stainless steel may be used as the material for the bellows-shaped member.

The first relay lens system 28I has a movable first lens 102 and a non-movable second lens 104. The first lens 102 can perform XY shifting and can be finely driven in the inclined direction by the actuator 98 attached outside the frame 82H and a moving mechanism not shown. In this configuration, the optical arrangement of the first relay lens system 28I may be displaced from a predetermined position due to vibration travelling via the frame 82G to the frame 82H, the vibration being caused by the driving of the movable blades BL. It is possible, however, to adjust such displacement of the first lens 102 by causing an XY shift and finely driving it in the inclined direction by the actuator 98.

A sensor 106 detecting the driving amount of the lens 102 by the actuator 98 is provided outside the frame 82H. The output of this sensor 106 is sent to the main controller 50 (see FIG. 7), and the main controller 50 makes the adjustment described above by controlling the actuator 98 based on the output of the sensor 106.

A beam splitter 28H is diagonally provided at an angle of about 45° relative to the optical path of pulse ultraviolet beam in the frame 82I structuring the optical unit $84_9$. Once a positional relationship is set in a predetermined position, it is not necessary to adjust the positional relationship between the beam splitter 28H and the fixed lens 104 of the first relay lens system 28I, therefore, the frame 82H and the frame 82I are connected via the O-ring $86_6$. On the frame 82I, an integrator sensor 34 and a reflected beam monitor 38 are attached from the outside via attachment members 107 and 108. Wiring for these optical sensors are arranged outside the frame 82I so as not to impair the degree of chemical cleanliness interior of the frame. With the integrator sensor 34 and the reflected beam monitor 28, only the light receiving surfaces are facing the interior of the frame 82I.

An illuminating system aperture diaphragm plate 28G having a rotation shaft 112 via a bearing section 110 is rotatably attached to the frame 82J configuring the optical unit $84_{10}$. This illuminating system aperture diaphragm plate 28G is rotatably-driven by a motor 32 serving as an actuator arranged outside the frame 82J. A magnetic fluid seal is used between the bearing section 110 and the rotation shaft 112. As a result, the magnetic fluid serves as a kind of lubricant and enters the gap between the rotation shaft 112 and the bearing section 110, thus improving the air-tightness of the bearing section 110 as well as smoothing the rotation of the rotation shaft 112. In this case, for example, a fluorine-contained oil is used as the magnetic fluid. The fluorine-contained oil, being a chemically clean substance, prevents a decrease in the degree of chemical cleanliness.

Alternative to the magnetic fluid seal structure, the seal structure may be made of various polymer materials such as tetrafluoroethylene, tetrafluoroethylene-alkyl vinyl ether copolymer, or tetrafluoroethylene-hexafluoropropene copolymer. For example, a first polymer member of a circular shape can be fixed to the rotation shaft 112, and a second polymer member which has a contact surface with the first polymer member can be fixed to the frame 82J, which makes the rotation shaft 112 rotatable. In this case, when the first polymer member and the second polymer member come into contact with each other, the friction caused between the two is extremely small therefore the rotation shaft 112 can rotate smoothly. The first polymer member and the second polymer member can also be structured so that the second polymer member pressures the first polymer member, the first polymer member always being in contact with the second polymer member.

Outside the frame 82J, a sensor 114 for detecting the amount of rotation of the illuminating system aperture diaphragm plate 28G by the motor 32 is arranged. Output of the sensor 114 is sent to the main controller 50 (see FIG. 7), and the main controller 50 controls the motor 32 based on the output of the sensor 114 when switching the illuminating conditions.

The frame 82J is connected to the frame 82I via the expansible bellows-shaped member $96_2$ made of a secondary vulcanized fluororubber or stainless steel.

As is evident from the description above, among the optical units structuring the first partial illuminating optical system IOP1, for example, the optical units $84_7$ and $84_{10}$ are first optical units each having optical members such as drivable movable blades BL and the illuminating system aperture diaphragm plate 28G. The optical unit $84_8$ is a second optical unit having, an optical member of movable blades BL and the first relay lens system 28I serving as an optical element which has a movable amount smaller than the movable amount of, for example, the illuminating system aperture diaphragm plate 28G. The optical unit $84_9$ is a second optical unit having the non-movable beam splitter 28H as an optical element.

The frame configuring the first optical unit and the frame configuring the second optical unit are displaceably connected in respect to each other via the expansible bellows-shaped member 96. The frames configuring the second optical unit are fixed by the O-ring 86 so as to suppress relative displacement.

The frames of the first partial illuminating optical system IOP1, particularly the frames connected with the bellows-shaped members, are not steadily positioned. This is due to the support of the frames by the bellows-shaped member alone, therefore the frames require support from outside.

Consequently, as shown in FIG. 3, a flange is provided on the outer periphery of each frame, and supporting members to support the flange of each frame are arranged on the illuminating system housing member 22a, which is placed on the separation pedestal 22. A circular opening in a planar view, is formed in the center of the supporting member, and the frames 82G to 82J are inserted from above into this opening with the optical axis in the z direction, thereby making it possible to steadily hold the frame positions.

The flange arranged on each frame is integrally connected to the frame. The material for the frame and the flange must be a low thermal expansion material, such as Inver mentioned earlier.

Material such as ceramics or metal like stainless steel should preferably be used for the contact portions of the flange of the frame and the supporting member of the illuminating system housing 22a for securing the frame to be held precisely. The surface of the contact portion of the flange and the supporting member are coated by ceramics or metal material such as stainless steel, by flame coating.

The so-called kinematic supporting mount, to support the frame with the supporting member at three points including a point, a plane and a V-groove can be applied to the flange of the frame and the supporting member, similar to that of the projection optical system PL.

As a modification, the frame may be directly held on concrete called a pedestal in the building of a semiconductor plant.

The configuration of the condenser lens system 28D comprising a three-group zooming optical system and measures for chemical cleaning thereof will now be described with reference to FIG. 6. While the condenser lens system 28D is actually a three-group zooming optical system having three lenses, only a single lens 120 is shown in FIG. 5 for the sake of convenience, to avoid complication in the drawing.

Figure 6:
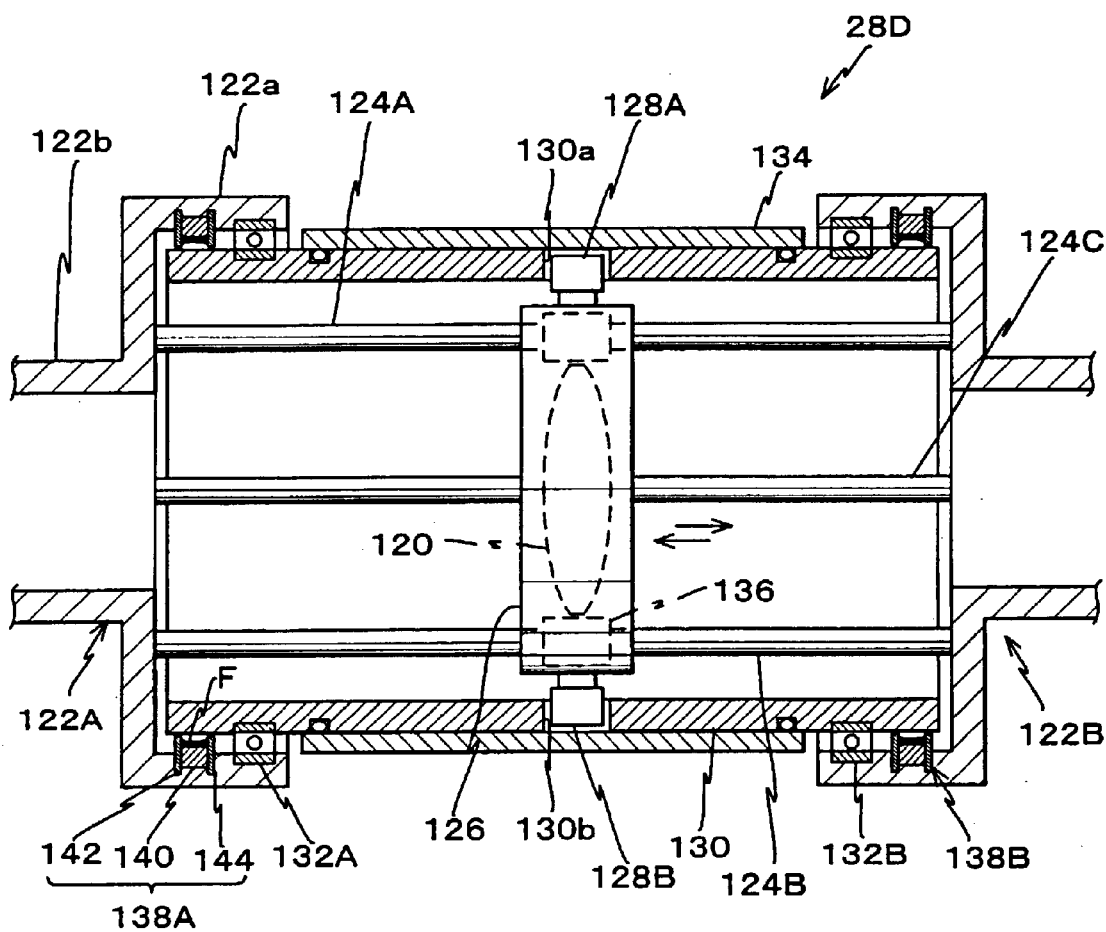
FIG. 6 is a sectional view illustrating a condenser lens system 28D in a simplified form, to explain the condenser lens system 28D shown in FIG. 2 and measures for chemical cleaning.

As shown in FIG. 6, the condenser lens system 28D comprises a pair of supporting frames 122A and 122B having a bottomed cylinder 122a opening at one end and a cylindrical extension 122b extending from an inner bottom of the bottomed cylinder 122a at the other end, a plurality (three in this case) of spline shafts 124A, 124B and 124C for vacuum coaxially connecting these supporting frames 122A and 122B, a cylindrical barrel 126 slidably attached to the spline shafts 124A, 124B and 124C for vacuum, vacuum bearings 128A and 128B arranged each projected on a side and the other side of the outer periphery of the barrel 126, and a cylindrical cam 130 made of a magnetic material having cam grooves 130a and 130b formed thereon engaging respectively with the bearings 128A and 128B for vacuum.

Bearings (ball bearings) 132A and 132B are arranged near one end and the other end in the longitudinal direction of the cylindrical cam 130, and is rotatably supported by the supporting frames 122A and 122B via these bearings 132A and 132B, respectively. The cam grooves 130a and 130b described above are diagonal grooves formed in the same direction along the circumferential surface of the cylindrical cam 130. A cover 134 covering the cam grooves 130a and 130b is attached to the outer periphery of the cylindrical cam 130 via an O-ring.

The spline shafts for vacuum 124A, 124B and 124C are arranged at intervals of substantially 120°, and directly driven guide members 136 for vacuum which have built-in balls corresponding to these spline shafts 124A, 124B and 124C are arranged on the barrel 126, respectively.

Therefore, the vacuum bearings 128A and 128B are guided by the cam grooves 130a and 130b, respectively, along with rotation of the cylindrical cam 139. As a result, the barrel 126 having the bearings for vacuum 128A and 128B provided thereon reciprocates along the spline shafts 124A, 124B and 124C.

In the actual condenser lens system, the barrels holding the three lenses individually move along the nine spline shafts for vacuum installed between the supporting frames at intervals of substantially 40°. As a result, on the cylindrical cam, two cam grooves each to guide the barrels for the three barrels, therefore a total of six grooves are formed via the two vacuum bearings arranged in each of the three barrels. In actual, the cylindrical cam 130 can be manually or electrically driven via a gear mechanism not shown in Figs.

Magnetic fluid holding mechanisms 138A and 138B corresponding to one end and the other end in the longitudinal direction of the cylindrical cam 130 are arranged, respectively, on the inner periphery of the supporting frames 122A and 122B. The magnetic fluid holding mechanism 138A has a ring-shaped permanent magnet 140, and two ring-shaped yokes 142 and 144 fixed to one end and the other end in the longitudinal direction of the spline shafts of this permanent magnet 140. In the case the cylindrical cam 130 is not attached to the inner periphery of the magnetic fluid holding mechanism 138A, a magnetic fluid F is held in the gap between the yokes 142 and 144 on the inner periphery side of the permanent magnet 140 by magnetic force and surface tension. As shown in FIG. 5, in the case the cylindrical cam 130 is attached to the inner periphery of the magnetic fluid holding mechanism 138A, a magnetic circuit path via the permanent magnet 140→yoke 142→cylindrical cam 130→yoke 144→permanent magnet 140 is formed. Then, the magnetic fluid enters the gap between the inner peripheral surfaces of the yokes 142 and 144 and the outer peripheral surface of the cylindrical cam and seal the gap. In this case, the magnetic resistance of the cylindrical cam 130 is smaller than that of the magnetic fluid. As the magnetic fluid, for example, a fluorine-contained oil is employed. Because the fluorine-contained oil is chemically clean, it is possible to suppress a decrease in the degree of chemical cleanliness. The other magnetic fluid holding mechanism 138B has the identical configuration, in which the gap between the inner peripheral surface of the yoke and the outer peripheral surface of the cylindrical cam 130 is sealed with a magnetic fluid F. Supporting frames 122A and 122B, the barrel 126, the cylindrical cam 130, and the cover 134 are made of a chemically clean material such as stainless steel.

As stated above, the environment surrounding the lens 120 can be cut off from the open air, by sealing the space between the inner periphery of the yoke and the outer periphery of the cylindrical cam 130 with the magnetic fluid F.

Bearings 132A and 132B are also provided in the cylindrical cam 130. The magnetic fluid holding mechanism 138A and 138B are, however, arranged between the environment of the lens 120 and the bearings 132A and 132B, so as to effectively prevent the dust generated from the bearings 132A and 132B mixing into the environment surrounding the lens 120.

In this case, instead of the magnetic fluid holding mechanism 138A and 138B using the magnetic fluid F, various polymer materials (such as teflon) can be used in the seal structure, as described earlier. For example, the first polymer member mentioned earlier can be fixed to the outer peripheral surface of the cylindrical cam 130, and on the bottomed cylinder 122a of the supporting frames 122A and 122B, the second polymer member can be arranged. The second polymer member is circular shaped, and its inner peripheral surface contacts the outer peripheral surface of the first polymer member.

The beam forming optical system 28B which comprises a two-group zooming optical system is also configured in the same manner as in the condenser lens system 28D described earlier, and the movable element is driven similarly.

The remaining optical members configuring the first partial illuminating optical system IOP1, i.e., the second fly-eye lens system 28F, the vibrating mirror 28E, the first fly-eye lens system 28C, the mirror M2, the beam forming optical system 28B, the variable beam attenuator 28A and the mirror M1 are held in chemically cleaned frames in the same manner as above, and form optical units. The optical members and the frames holding the optical members which have a large movable amount such as the vibrating mirror 28E, the first fly-eye lens system 28C, and the variable beam attenuator 28A form the first optical unit. The remaining fixed optical elements or optical elements having a small movable amount such as movable optical members moving in a non-exposure state and frames holding the same, form the second optical unit. An example of a movable optical member moving in a non-exposure state, is a case when the optical axis of at least one of the relay lens system 28M, the lens 28L and the mirror M4 housed in the illuminating system housing 26B is structured to be movable in respect to the optical axis of the other lenses or mirrors.

The frame forming the first optical unit and the frame forming the second optical unit are connected to each other via the expansible bellows-shaped member 96, relative displacement being allowed. More specifically, in this embodiment, frames requiring relative displacement to an extent are connected with a suitable bellows-shaped member 96. This improves air-tightness of the space within the frame and the space between adjacent frames. The frames displaceably connected in respect to each other via the bellows-shaped member 96 can be easily separated by removing the bellows-shaped member 96, thus simplifies replacement of an optical unit having the frame.

The frames forming the second optical unit are fixed (connected) to suppress relative displacement via the O-ring 86. That is, in this embodiment, frames are connected by a suitable connecting member (O-ring) between frames that do not require relative displacement, to improve air-tightness in the spaces in the frames and the space between the frames.

In the case of connecting a frame having a non-movable lens and a frame of the adjacent optical unit, the following method may be adopted. When it is not necessary to make a adjustment after connection, and a positional relationship can be set in a predetermined position with high accuracy, the frames are fixed so that relative displacement is almost completely limited between each other via the O-ring serving as the connecting member. When adjustment is necessary after connection, and it is difficult to set a predetermined positional relationship with sufficient accuracy, the frames are connected via a bellows-shaped member.

In this embodiment, the illuminating system housing 26A (see FIG. 3) of the first partial illuminating optical system IOP1 serving as in general the first illuminating system housing, is structured of the frame and the sequentially connected bellows-shaped members that form the optical unit as described above.

With the exposure apparatus 10 of this embodiment, in the interiors of the first illuminating system housing 26A and the second illuminating system housing 26B forming the first partial illuminating optical system IOP1 and the second partial illuminating optical system IOP2, i.e., in spaces in the frames forming the optical unit and the spaces between the adjacent frames having air-tightness improved as above, a low-absorptivity gas such as clean and dried nitrogen gas (or helium gas) which has an air (oxygen) mixture of under 1 ppm is purged.

A low-absorptivity gas such as clean and dried nitrogen gas (or helium gas) having an air (oxygen) mixture of under 1 ppm is purged also in the barrel of the projection optical system PL.

FIG. 7 schematically illustrates the configuration of the control system of the exposure apparatus 10. This control system is built, with the main controller 50 comprising a workstation (or microcomputer) in the center. Other than the various controls described above, the main controller 50 performs overall control of the apparatus.

Next, the operation of the exposure apparatus 10 which has the configuration mentioned above will be described.

As a premise, various conditions for scanning exposure are set in advance to scan and expose the shot area on the wafer W in an appropriate amount of exposure (target exposure amount). Reticle alignment which uses a reticle microscope not shown in Figs. and an off-axis alignment sensor not shown in Figs, baseline measurement are also performed. Then, fine alignment of the wafer W by an alignment sensor (EGA: enhanced global alignment) is completed, and arrangement coordinates of a plurality of shot areas on the wafer W are determined. The EGA is disclosed, for example, in Japan Patent Laid Open No. 61-44429 and the corresponding U.S. Pat. No. 4,780,617, which are fully incorporated by reference herein.

After the pre-operations for exposure of the wafer W are completed, the main controller 50 controls the wafer stage driving system 74 while monitoring measured values of the wafer laser interferometer 80 based on the alignment results. Then, the main controller 50 moves the wafer stage WST to the starting position of scanning a first shot area on the wafer W.

The main controller 50 starts scanning in the Y direction of the reticle stage RST and the wafer stage WST via the reticle stage driving system 68 and the wafer stage driving system 74. When the target scanning speeds for the both stages RST and WST are respectively reached, the pulse ultraviolet beam starts illumination of the pattern area of the reticle, and scanning exposure is performed.

Prior to exposure, the light source 12 is turned on, however, similar to a scanning stepper, the pulse ultraviolet beam irradiating areas outside the pattern area on the reticle R is cut off. This is due to the main controller 50, which synchronously controls the movable blades BL of the movable blind 28J structuring the reticle blind unit, and the movement of the reticle stage RST.

The main controller 50 synchronously controls the reticle stage RST and the wafer stage WST via the reticle stage driving system 68 and the wafer stage driving system 74. By this control, the velocity ratio Vr of the reticle stage RST in the Y-axis direction and the velocity ratio Vw of the wafer stage in the Y-axis direction are maintained so as to correspond to the projection magnifications (¼ times, ⅕ times, ⅙ times) of the projection optical system PL upon exposure.

Different portions of the pattern area of the reticle R are sequentially illuminated by the pulse ultraviolet beam, and illumination of the entire pattern area is completed, completing the scanning exposure of the first shot area on the wafer W. The pattern of the reticle R is thus transferred in a reduced size onto the first shot area through the projection optical system PL.

When scanning exposure of the first shot is completed as described above, the main controller 50 steps the wafer stage WST in the X and Y directions via the wafer stage driving system 74 and moves it to the starting position for scanning exposure of the second shot area. Upon stepping, the main controller 50 measures positional displacements of the wafer stage WST in the X, Y and θz directions in a real-time manner based on measured values of the wafer laser interferometer 80 which detects the position of the wafer stage WST (position of the wafer W). In accordance with the result of this measurement, the main controller 50 controls the wafer stage driving system 74 to position the wafer stage WST so that the XY positional displacements of the wafer stage are set in a predetermined state.

The main controller 50 controls the reticle stage driving system 68 based on information on displacement of the wafer stage WST in the θz direction, and rotatably controls the reticle stage RST so as to compensate the error in the rotation displacement of the wafer W side.

The main controller 50 repeatedly performs scanning exposure for the second shot area in the same manner as described above.

The stepping operation performed in between exposure of shot areas on the wafer W is repeated as described above, and the patterns of the reticle R are sequentially transferred onto all the shot areas for exposure on the wafer W.

During the stepping operation between shots or during scanning exposure, reaction force caused by the movement of the individual stages generates vibration in the main portion column 14. The main controller 50, however, detects vibration of the main portion column 14 in directions of the six freedom degrees, based on the output of the vibration sensor group 66 and controls the vibration isolating units 42A to 42D based on the results of this detection. Therefore, vibration of the main portion column 14 is promptly attenuated, thus making it possible to effectively prevent a pattern transfer positional shift or an image blur caused by vibration of the projection optical system PL.

According to the exposure apparatus 10 of this embodiment, as described above in detail, the illuminating optical system IOP is configured of a plurality of optical units having chemically cleaned frames. In between frames that require relative displacement, connection is accomplished via an expansible bellows-shaped member 96 made of a chemically clean material. In between frames not requiring relative displacement, connection (fixing) is done via an O-ring 86 made of a chemically clean material. Therefore, the optical units can function effectively, and it is possible to improve air-tightness in the frame interior space and the space between adjacent frames. Since nitrogen gas that has an air (oxygen) mixture of under 1 ppm is purged in the space in the frame and space between adjacent frames, it is possible to improve the degree of chemical cleanliness of the interior. This suppress deposition and accumulation of substances clouding the surface of an optical element such as lenses in the interior, and also suppress absorption of the pulse ultraviolet beam (energy beam) by an absorptive gas (oxygen, water vapor, hydrocarbon or the like) in the first partial illuminating optical system IOP1 and the second partial illuminating optical system IOP2. Thus, the decrease in intensity of the ultraviolet pulse beam irradiated onto the reticle and the wafer W can be reduced, for a long period of time.

In this embodiment, the actuators driving the movable members such as the movable blades BL, the vibrating mirror 28E, and the illuminating system aperture diaphragm plate 28G are arranged outside the illuminating system housing 26A (i.e., each frame) of the first partial illuminating optical system IOP. Thus these actuators are not the source of pollution in the illuminating system housing, therefore it is possible to improve the degree of chemical cleanliness in the interior. As with the actuators, the sensors are also not a pollution source in the illuminating system housings, therefore the presence of the sensors do not cause a decrease in the degree of chemical cleanliness in the illuminating system housings. Moreover, the actuators can be accurately controlled by the sensor output and the accuracy of positional control to movable optical members such as the movable blades, the vibrating mirror, the illuminating system aperture diaphragm plate and the first fly-eye lens system can be highly improved.

Magnetic fluid seals are used for the bearing sections of all the rotating members having rotation shaft arranged in the illuminating system housing 26A. The magnetic fluid enters the gap between a rotation shaft and a bearing section, and can effectively prevent the dust generated by the bearing 132A and 132B from mixing into the environment surrounding the lens 120, thus improving air-tightness at the bearing section and smoothing rotation of the rotation shaft. A fluorine-contained oil which is a chemically cleansed, is used for magnetic fluid sealing. It is therefore possible to suppress a decrease in the degree of chemical cleanliness.

In the exposure apparatus of this embodiment, chemical cleanliness in the interior of the illuminating optical system IOP can be improved through various contrivances as described above. As a result, even when a pulse ultraviolet beam having a wavelength of about 193 nm is used as an energy beam for exposure (exposure light), it is possible to effectively suppress a decrease in transmittance or the like of the optical elements in the illuminating optical system IOP. Therefore, a highly accurate (high-resolution) exposure can be performed by using the short-wavelength energy beam as described above, and simultaneously, the throughput can be improved due to the reduction of the exposure time, by reducing a decrease in the amount of exposure light irradiated onto the wafer surface.

The illuminating optical system IOP is divided into the first partial illuminating optical system IOP1 which includes movable blades BL and a vibrating mirror 28E movable during exposure, and the second partial illuminating optical system IOP2 which includes only optical members not movable during exposure. The illuminating optical system IOP2 supports the reticle stage RST, the projection optical system PL and the wafer stage WST, and the illuminating optical system 10P2 is arranged together with these components on the main portion column 14 which configures the main portion of the exposure apparatus. The first partial illuminating optical system IOP1 is arranged on a separate pedestal 22 separated from the main portion column 14. As a result, even if portions such as the movable blades BL largely move upon exposure and vibration is caused in the first illuminating optical system IOP1, the residual vibration remaining does not affect the second partial illuminating optical system IOP2 and the main portion of the exposure apparatus. More specifically, the main portion column 14 and the reticle stage RST supported on the main portion column 14, the projection optical system PL, and the wafer stage WST are not affected by the vibration. In the exposure apparatus 10 of this embodiment, therefore, the vibration of the illuminating optical system upon exposure affecting the main portion of the exposure apparatus (main portion column 14 side) can be reduced, and as a result, the exposure accuracy can be improved.

The first illuminating system housing 26A configuring the first partial illuminating optical system IOP1 and the second illuminating system housing 26B configuring the second partial illuminating optical system IOP2 are connected by an expansible bellows-shaped member 94. This bellows-shaped member 94 isolates the space between these housings from the open air, and the dried nitrogen gas (or helium gas) mentioned earlier, is purged therein. Absorption of the pulse ultraviolet beam (energy beam) by the absorptive gas can also be suppressed at this portion. Furthermore, the bellows-shaped member 94 connects the first illuminating system housing 26A and the second illuminating system housing 26B so as to limit the transfer of vibration between these two housings. Therefore, even if the vibration of the first illuminating system housing during exposure is transferred to the second illuminating system housing and the main portion column 14 (exposure main portion), the exposure accuracy is hardly affected.

In the aforementioned embodiment, the frame 82G configuring the first partial illuminating optical system IOP1 and the frame 82H are connected via the bellows-shaped member 96, and the frame 82I and the frame 82J are connected by means of the bellows-shaped member $96_2$. However, they may be connected with O-rings as in the second partial illuminating optical system IOP2. That is, in this embodiment, it suffices that the first partial illuminating optical system IOP1 and the second partial illuminating optical system IOP2 are connected with the bellows-shaped member 94.

In the embodiment above, a case in which bellows-shaped members 94 and 96 made of a fluororubber subjected to secondary vulcanization are employed has been described. Alternatively, a surface chemically cleaned surface, for example, a resinous O-ring coated with a fluoropolymers may be used as the O-ring.

Also, in the embodiment above, an ArF excimer laser light source, a KrF excimer laser light source, or an $F_2$ laser light source is to be used as a light source. However, the present invention is not limited to this, and a vacuum ultraviolet light source such as a $Kr_2$ laser source having a wavelength of 146 nm, or an $Ar_2$ laser source having a wavelength of 126 nm may be used. In this case, it is possible to further improve the resolution by a pulse ultraviolet beam of a shorter wavelength, and hence to perform exposure with higher accuracy.

In the embodiment above, the case when the second partial illuminating optical system IOP2 comprises only non-movable optical elements such as lenses and mirrors has been described. The present invention is not, however, limited to this. The second partial illuminating optical system may have movable optical members, which are stationary during exposure and are movable upon non-exposure. An example of an optical member movable upon non-exposure, is when the optical axis of at least one of the relay lens systems 28M, the lens 28L and the mirror M4 that are housed in the illuminating system housing 26B is drivable, in respect to the optical axis of the other lens or mirror upon non-exposure. Alternatively, the second partial illuminating optical system IOP2 may comprise a movable section (second movable section) moving in an amount smaller than that of the movable blades BL during exposure. It includes a case where at least one of the relay lens systems 28M, the lens 28L and the mirror M4 is movable in an amount smaller than that of the movable blades BL during exposure. In such cases, vibration of the second partial illuminating optical system IOP2 and of the main portion of exposure can obviously be reduced compared with the case where residual vibration of the first partial illuminating optical system IOP1 is directly transferred to the second partial illuminating optical system IOP2.

In the embodiment mentioned above, an illuminating system aperture diaphragm plate 28G is arranged as an aperture diaphragm near the emitting surface of the second fly-eye lens system 28F serving as an optical integrator. In place of this, however, an iris diaphragm of which the numerical aperture is continuously variable may be arranged. Alternatively, an illuminating system aperture diaphragm plate 28G and an iris diaphragm with a switching unit may be arranged near the emitting surface of the optical integrator. The switching unit positions at least one of the aperture diaphragm and the iris diaphragm on the illuminating aperture diaphragm plate 28G on the emitting surface of the optical integrator.

The embodiment above has a configuration in which the first and second illuminating system housings 26A and 26B structuring the first and second partial illuminating optical systems IOP1 and IOP2 are connected by the frames holding one or more optical members sequentially via a connecting members. The interiors thereof are made air-tight against the open air, and the interiors are filled with a clean and dried nitrogen gas ($N_2$) or helium gas (He) having an air (oxygen) mixture of under 1 ppm. The present invention is not, however, limited to this configuration. For example, the configuration may be such that the first illuminating system housing 26A and the second illuminating system housing 26B are respectively integrally formed. The optical members are arranged therein in the same manner as in the embodiment above, and nitrogen gas or the like is purged in these housings. Or, the first and second illuminating system housings 26A and 26B may be covered with separate cases, and the interiors thereof may be filled with clean and dried nitrogen gas ($N_2$) or helium gas (He). In other words, the interior of the illuminating optical system may be purged with a double structure. In the case of purging the interior of the illuminating optical system with a double structure, different kinds of gas may be used for the inner and outer portion of the housing. For example, dried nitrogen or helium gas may be used inside the housing, and dried air may be used in the outer portion of the housing, inside the case.

Furthermore, it is preferable to replace the interior of the illuminating system housing member 22a with dried nitrogen gas, helium gas or dried air. In this case, a driving mechanism such as a motor is housed in the illuminating system housing member 22a, therefore replacement of gas is preferable at all times.

In the embodiment described earlier, the wafer stage WST is mounted on a wafer base bed 54 for a wafer, suspension-supported from the bed 44. The invention is not however limited to this. The invention is suitably applicable to a scanning type exposure apparatus of a type in which a base bed for a wafer is provided separately from the main portion column supporting the reticle stage (and the projection optical system PL). Provided however that, in this case, the positional relationship between the main portion column and the base bed for a wafer need to be detected at all times. Therefore, for example, a positional sensor to measure the positional relationship between the base plate and the main portion column need to be arranged, as well as a positional sensor to measure the positional relationship between the base plate and the base bed for a wafer. The main portion column is to be arranged on the base plate.

In the embodiment above, the first partial illuminating optical system IOP1 (separation pedestal 22) is installed on the base plate BP. The present invention is not, however, limited to this, and the first partial illuminating optical system IOP1 (separation pedestal 22) may be installed on a pedestal other than the base plate BP, such as a on concrete block called pedestal which is arranged in building of a semiconductor plant.

In the embodiment previously described, a fly-eye lens is used as the optical integrator (homogenizer). Alternatively, a rod integrator may be used. In an illuminating optical system using the rod integrator, the emitting surface of the rod integrator is arranged so as to be substantially conjugate with the pattern surface of the reticle R. For example, the movable blades BL of the movable blind 28J are arranged near the emitting surface of the rod integrator. Accordingly, the illuminating optical system is divided into two with the rod integrator as the boundary. Identically, as in the embodiment above, the movable blind is arranged in the first portion where the rod integrator is arranged, and the fixed blind is arranged in the second portion to the main portion column. The illuminating optical system using a rod integrator is disclosed, for example, in the U.S. Pat. No. 5,675,401. Furthermore, a fly-eye lens may be combined with a rod integrator, or two-rod integrators being arranged in series can be used as a double optical integrator.

The main controller 50 controls various components shown on the right side of FIG. 7, as in the embodiment described above, however, the present invention is not limited to this. The components may be controlled individually by respective controllers, or a plurality of controllers may control a combination of the components.

The embodiment above describes the case where active vibration isolators are used as the vibration isolating units 42A to 42D. The present invention is not limited to this, and the isolators may be passive vibration isolators.

In the case the exposure apparatus uses an ultraviolet beam as in the embodiment described above, for example, a reflection system comprising only reflecting optical elements, or a reflection/refraction system (catadioptric system) having reflecting optical elements and refracting optical elements may be adopted. The reflection/refraction type projection optical system is disclosed, for example, in Japan Patent Laid Open No. 08-171054, and the corresponding U.S. Pat. No. 5,668,672, and Japan Patent Laid Open No. 10-20195 and the corresponding U.S. Pat. No. 5,835,275 as a reflection/refraction system having a beam splitter and a concave mirror as reflecting optical elements. Also, in Japan Patent Laid Open No. 08-334695 and the corresponding U.S. Pat. No. 5,689,377, and Japan Patent Laid Open No. 10-3039 and the corresponding U.S. Pat. No. 873,605 (application filed: Jun. 12, 1997), a reflection/refraction system not using a beam splitter as a reflecting optical element, but using a concave mirror or the like, is described. These descriptions of the Japan Patent Laid Open and corresponding U.S. Patent referred to above, are fully incorporated by reference herein.

Furthermore, a reflection/refraction system in which a plurality of refracting optical elements and two mirrors (a concave mirror serving as a main mirror, and a sub-mirror serving as a back-mirror forming a reflection plane on the side opposite to the incident plane of a refracting element or a parallel flat plate) may be employed. The two mirrors are arranged on an axis, and an intermediate image of the reticle pattern formed by the plurality of refracting optical elements is re-formed on the wafer by means of the main mirror and the sub-mirror, as disclosed in Japan Patent Laid Open No. 10-104513 and the corresponding U.S. Pat. No. 5,488,229, which are fully incorporated by reference herein. In this reflection/refraction system, the main mirror and the sub-mirror are arranged in succession to the plurality of refracting optical elements. The illuminating light passes through a part of the main mirror and is reflected on the sub-mirror and then the main mirror. It further proceeds through a part of the sub-mirror and reaches the wafer.

Also, as the reflection/refraction type projection optical system, a reduction system having, for example, a circular image field, in which both the object side and the image side are telecentric, and the projecting magnifications are ¼ times or ⅕ times can be employed. In the case of a scanning type exposure apparatus using this reflection/refraction type projection optical system, it may be of the type in which the irradiation area of the illuminating light is positioned substantially around the optical axis within the viewing field of the projection optical system, and is shaped in a rectangular slit extending in a direction substantially perpendicular to the scanning direction of the reticle or the wafer. According to the scanning type exposure apparatus having such a reflection/refraction type projection optical system, it is possible to transfer a fine pattern of 100 nmL/S on the wafer with a high precision even when using $F_2$ laser beam having a wavelength of 157 nm as the illuminating light for exposure.

Furthermore, as the vacuum ultraviolet beam, ArF excimer laser beam or $F_2$ laser beam is used. Harmonics produced by amplifying a single-wavelength laser beam within the infrared region or visible region oscillated from a DFB semiconductor laser or a fiber laser with a fiber amplifier doped, for example, with erbium Er (or both erbium and ytterbium (Yb)), and wavelength-converted into an ultraviolet beam by the use of a non-linear optical crystal can also be employed.

If the oscillation wavelength of a single-wavelength laser is assumed to be within a range of 1.51 to 1.59 µm, an eighth-harmonics of which the generation wavelength is within a range of from 189 to 199 nm, or a tenth harmonics of which the generation wavelength is within a range of from 151 to 159 nm is output. Particularly when using an oscillation wavelength within a range of from 1.544 to 1.553 µm, an eighth harmonics of which the generation wavelength is within a range of from 193 to 194 nm, i.e., an ultraviolet beam having almost the same wavelength as ArF excimer laser beam is available. With an oscillating wavelength within a range of from 1.57 to 1.58 µm, a tenth harmonics of which the generation wavelength is within a range of from 157 to 158 nm, i.e., an ultraviolet beam having substantially the same wavelength as $F_2$ laser beam is available.

With an oscillating wavelength within a range of from 1.30 to 1.12 μm, a seventh harmonics of which the generation wavelength is within a range of from 147 to 160 nm is provided. Particularly, with an oscillating wavelength within a range of from 157 to 158 μm, an ultraviolet beam having substantially the same wavelength as $F_2$ laser beam is obtained. In this case, for example, ytterbium doped fiber laser can be used as a single-wavelength oscillating laser.

The present invention can be applicable for manufacturing not only microdevices such as semiconductor devices, but also for manufacturing reticles or masks which are used in an optical exposure apparatus, an EUV exposure apparatus, an X-ray exposure apparatus, and an electron beam exposure apparatus. That is, the exposure apparatus can transfer a circuit pattern onto a glass substrate or a silicon wafer. In an exposure apparatus using DUV (distant ultraviolet) beam or VUV (vacuum ultraviolet) beam, a transmission type reticle is generally employed. As the reticle substrate, a quartz glass, fluorine-doped quartz glass, fluorite, magnesium fluoride or rock crystal is used. In a proximity type X-ray exposure apparatus and an electron beam exposure apparatus, a transmission type mask (stencil mask, membrane mask) is used, and a silicon wafer is used as the mask substrate.

It is needless to mention that the present invention can be also applied, not only to an exposure apparatus used for the manufacture of semiconductor devices, but also to an exposure apparatus transferring a device pattern onto a glass plate, used for the manufacture of displays including a liquid crystal display devices or the like, an exposure apparatus transferring a device pattern onto a ceramics wafer used for the manufacture of thin film magnetic heads, and an exposure apparatus used for the manufacture of pickup devices (such as CCD), micromachines or DNA chips.

In the embodiment above, the case of a scanning stepper has been described. The present invention is suitably applicable also, to a reduction projecting exposure apparatus using the step-and-repeat method which transfers a mask pattern with the mask and the substrate stationary, and moving the substrate stepwise sequentially. A proximity exposure apparatus transferring a mask pattern onto a substrate by bringing the mask into close contact with the substrate without using a projection optical system can also be used.

The sealed state, described in the present invention, is a state where a gas does not flow through an internal and external space. The state where the gas can flow in between the internal and external space, but the gas flowing from the external space to the internal space being restricted, is also included. For example, as with the case when the gas pressure of the internal space is maintained higher than that of the external space, so as to create a gas flow of the gas flowing into the external space.

In the case of using a linear motor for the wafer stage or the reticle stage (see the U.S. Pat. No. 5,623,853 or the U.S. Pat. No. 5,528,118), it is not limited to an air-floating type using an air bearing, and the magnetic floating type using Lorentz force or using reactance force may be utilized.

The stage may be of a type moving along the guide or of a guideless type without a guide.

The exposure apparatus of the embodiment above can be made by mounting the second partial illuminating optical system IOP2 structured of a plurality of lenses and the projection optical system PL on the main portion column 14, mounting the first partial illuminating optical system IOP1 on the separation pedestal 22. The housings of the second partial illuminating optical system IOP2 and the first partial illuminating optical system are connected together by the bellows-shaped member 94 which allows relative displacement as well as suppress the transfer of vibration. Then, optical adjustment is performed, and the reticle stage and the wafer stage comprising many mechanical parts are incorporated on the main portion column. Wiring and piping are connected and then comprehensive adjustment (electric adjustment and operational confirmation) is conducted. Making of the exposure apparatus should preferably be performed in a clean room in which temperature and the degree of cleanliness are controlled.

Throughholes for insertion of tools may be pierced in the beam matching unit, the barrel of the projection optical system PL, and the illuminating optical system unit, for the purpose of adjusting the relative position of units or position of optical elements in the interior. Presence of throughholes creates the risk of polluted air coming in through this portion in the interior, therefore, when making the exposure apparatus, it is necessary to inspect the presence of throughholes in each of the units and barrels. If throughholes are found, they must be covered with an outgassing material.

Each unit comprises a unit main portion having a U-shaped cross-section for housing the optical members, and a panel portion for covering the openings on the unit main portion. Therefore, a packing similar to the O-ring as shown in FIGS. 4A to 5B may be provided between the unit main portion and the panel portion.

A semiconductor device is manufactured through the steps of conducting function and performance design of the device, of manufacturing a reticle on based on this design step, manufacturing wafers from a silicon material, transferring the reticle pattern onto the wafer by the use of the exposure apparatus of the embodiment above, assembling the device (including a dicing process, a bonding step, and a packaging process), and inspection.

<<Device Manufacturing Method>>

A device manufacturing method using the above exposure apparatus and method in a lithographic process will be described in detail next.

Figure 8:
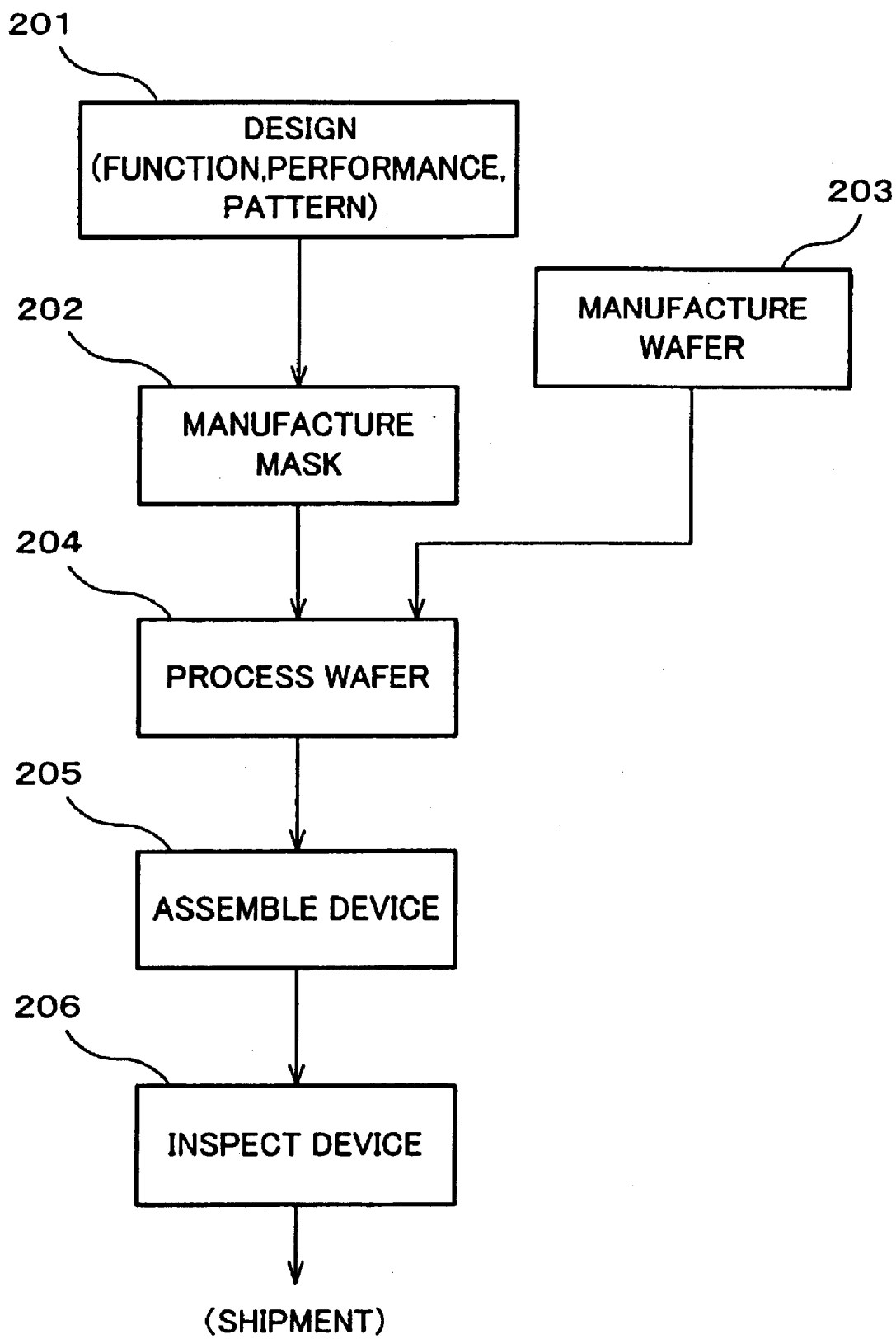
FIG. 8 is a flow chart for explaining an embodiment of a device manufacturing method.

FIG. 8 is a flow chart showing an example of manufacturing a device (a semiconductor chip such as an IC or LSI, a liquid crystal panel, a CCD, a thin magnetic head, a micromachine, or the like). As shown in FIG. 8, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. In step 203 (wafer manufacturing step), a wafer is manufacturing by using a silicon material or the like.

In step 204 (wafer processing step), an actual circuit and the like are formed on the wafer by lithography or the like using the mask and wafer prepared in steps 201 to 203, as will be described later. In step 205 (device assembly step), a device is assembled by using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 9:
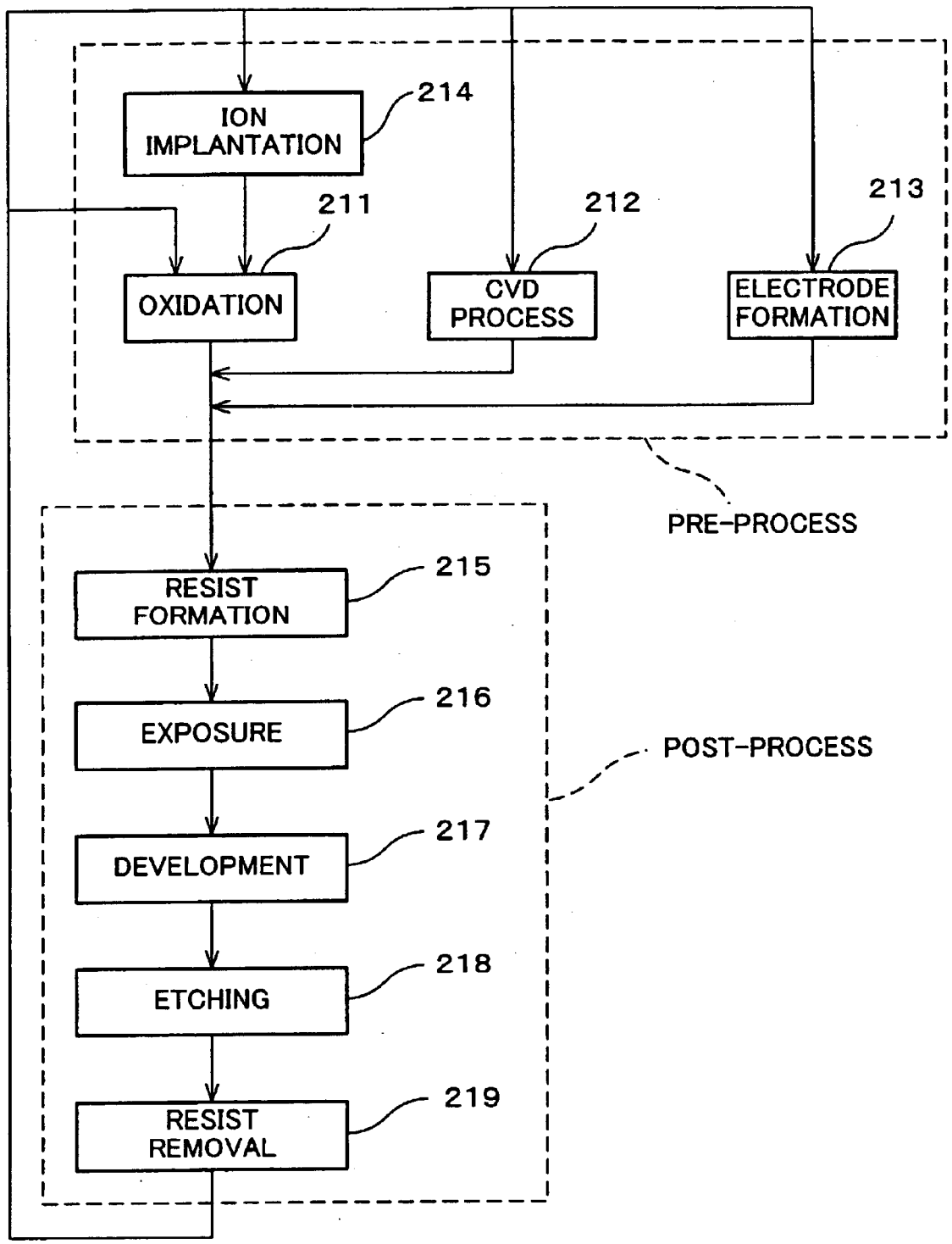
FIG. 9 is a flow chart showing processing in step 204 in FIG. 8.
Figure 10:
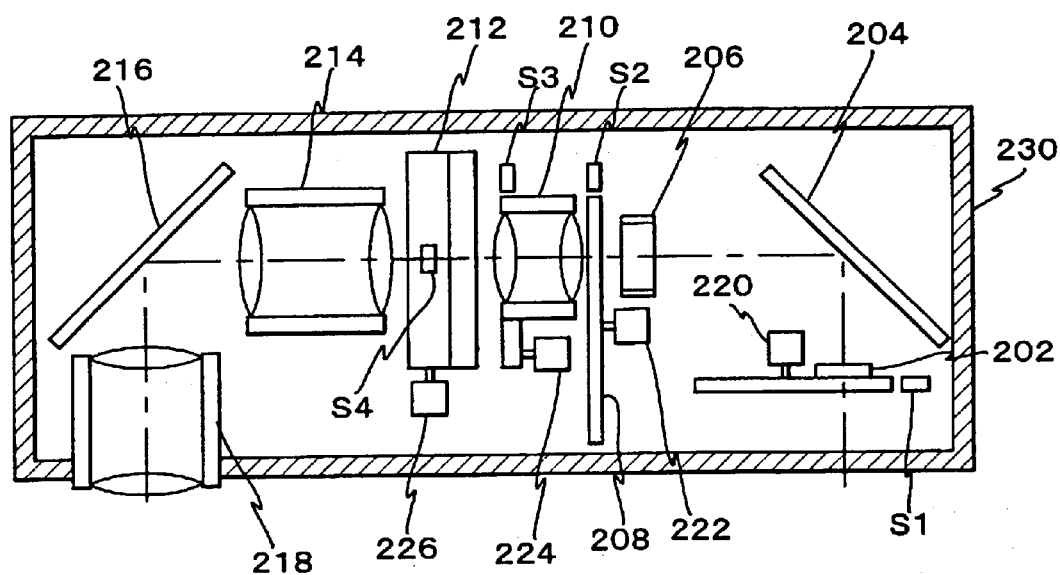
FIG. 10 is a sectional view illustrating the configuration of a conventional illuminating optical system.

FIG. 9 is a flow chart showing a detailed example of step 204 described above in manufacturing the semiconductor device. Referring to FIG. 9, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transcribed onto the wafer by the above exposure apparatus and method. Then, in step 217 (developing step), the exposed wafer is developed. In step 218 (etching step), an exposed member on a portion other than a portion where the resist is left is removed by etching. Finally, in step 219 (resist removing step), the unnecessary resist after the etching is removed.

By repeatedly performing these pre-process and post-process, multiple circuit patterns are formed on the wafer.

According to the device manufacturing method of this embodiment, as described above, exposure is performed by the use of the exposure apparatus of this embodiment in the exposure step (step 216). Therefore, chemical cleanliness in the illuminating optical system IOP can be maintained even when using, for example, illuminating light (exposure light) which has a wavelength of up to 200 nm, such as ArF excimer laser beam or $F_2$ laser beam. Accordingly, it becomes possible to maintain good transmittance and accurately form a fine pattern which has a minimum practical line width of about 0.1 µm on the wafer (substrate), thus permitting the manufacture of high-integrity microdevices with a high productivity (including yield). KrF excimer laser beam may be used as the illuminating light for exposure.

While the above-described embodiments of the present invention are the presently preferred embodiments thereof, those skilled in the art of lithography systems will readily recognize that numerous additions, modifications and substitutions may be made to the above-described embodiments without departing from the spirit and scope thereof. It is intended that all such modifications, additions and substitutions fall within the scope of the present invention, which is best defined by the claims appended below.

What is claimed is:

1. An illuminating optical apparatus to illuminate an object with an energy beam from a light source, comprising:
   at least one of a first optical member which is arranged in between said light source and said object and is housed in a first frame, said first optical member being movable in the first frame
   a plurality of second optical members which are arranged in between said first optical member and said object and are respectively housed in a plurality of second frames different from said first frame, and of which a movable amount is smaller than a movable amount of said first optical member;
   a first connecting member which is provided in between said first frame and said second frame, encloses an optical path of said energy beam between said first frame and said second frame, and displaceably connects said first frame to said second frame; and
   a second connecting member which is provided among said second frames, and connects said second frames so as to suppress a displacement among said second frames.

2. An illuminating optical apparatus according to claim 1, wherein said first connecting member is a freely expansible bellows-shaped member of which an inner surface is chemically cleaned.

3. An illuminating optical apparatus according to claim 2, wherein said bellows-shaped member has an inner surface coated with fluoropolymers.

4. An illuminating optical apparatus according to claim 1, wherein said first connecting member comprises a secondary vulcanized fluororubber.

5. An illuminating optical apparatus according to claim 1, wherein said second connecting member is an O-ring which has at least a surface chemically cleaned.

6. An illuminating optical apparatus according to claim 5, wherein said O-ring comprises a resin, and has said surface coated with fluoropolymers.

7. An illuminating optical apparatus according to claim 1, wherein said second connecting member comprises a secondary vulcanized fluororubber.

8. An illuminating optical apparatus according to claim 7, wherein said second connecting member is an O-ring formed of a tube.

9. An illuminating optical apparatus according to claim 1, further comprising:
   an actuator which is arranged outside said first frame, and drives said first optical member held by said first frame.

10. An illuminating optical apparatus according to claim 9, further comprising
    a sensor which is arranged outside said illuminating system housing, and measures a position or a displacement of said first optical member.

11. An exposure apparatus for transferring a mask pattern onto a substrate, comprising:
    an illuminating optical apparatus according to claim 1 which illuminates said mask with an energy beam.

12. An exposure apparatus for transferring a mask pattern onto a substrate, comprising:
    an illuminating optical apparatus according to claim 10, which illuminates said mask with an energy beam.

13. An exposure apparatus of transferring a mask pattern onto a substrate by exposing said substrate with an energy beam from a light source via a mask, comprising:
    a first partial optical system which is arranged in between said light source and said mask and is housed in a first illuminating system housing, and contains a first movable section which is movable during exposure and an optical element of which a movable amount during said exposure is smaller than a movable amount of said first movable section;
    a suppressing member which is arranged in between said first movable section and said optical element, and suppresses vibration which travels between said first movable section and said optical element;
    a second partial optical system which is arranged in between said first partial optical system and said mask and is housed in a second illuminating system housing physically separated from said first illuminating system housing, and contains an optical member of which a movable amount during said exposure is smaller than a movable amount of said first movable section;
    a main portion for exposure on which said second partial optical system is provided, including at least a substrate stage which holds said substrate exposed by said energy beam outgoing from said mask; and
    a connecting section which is provided in between said first illuminating system housing and said second illuminating system housing, encloses an optical path of said energy beam between said first illuminating system housing and said second illuminating system housing, and limits the amount of vibration which travels between said first and second illumination system housings.

14. An exposure apparatus according to claim 13, wherein optical members in second partial optical system are stationary during said exposure.

15. An exposure apparatus according to claim 13, wherein said second partial optical system includes a second movable section movable in an amount smaller than that of said first movable section during said exposure.

16. An exposure apparatus according to claim 13, wherein a low-absorptive gas is supplied into said illuminating system housings.

17. An exposure apparatus according to claim 16, wherein said energy beam is a light beam having a wavelength not longer than 300 nm.

18. An exposure apparatus according to claim 13, wherein a low-absorptive gas is supplied into the space between said first and second illuminating system housings and an interior of said individual illuminating system housings.

19. An exposure apparatus according to claim 18, wherein said energy beam is a vacuum ultraviolet light beam, and a wavelength thereof is not longer than 200 nm.

20. An exposure apparatus according to claim 13, wherein said connecting section comprises an expansible bellows-shaped member.

21. An exposure apparatus according to claim 13, wherein said first partial optical system includes
an optical integrator, and a diaphragm plate of said illuminating system having at least one of a diaphragm arranged near an emitting surface of said optical integrator, and an iris diaphragm; and
said first movable section further has a switching unit which positions said at least one of diaphragm and said iris diaphragm, on the emitting surface of said optical integrator.

22. An exposure apparatus according to claim 13, wherein
said first movable section is a movable blade, which limits the irradiation area on said mask during exposure with said energy beam.

23. A method of making an exposure apparatus for transferring a mask pattern onto a substrate by exposing said substrate with the energy beam from a light source via the mask, comprising:
providing a first partial optical system which is arranged in between said light source and said mask and is housed in a first illuminating system housing, and contains a first movable section which is movable during exposure and an optical element of which a movable amount during said exposure is smaller than a movable amount of said first movable section;
providing a suppressing member which is arranged in between said first movable section and said optical element, and suppresses vibration which travels between said first movable section and said optical element;
providing a second partial optical system which is arranged in between said first partial optical system and said mask and is housed in a second illuminating system housing physically separated from said first illuminating system housing, and contains an optical member of which a movable amount during said exposure is smaller than a movable amount of said first movable section;
providing a main portion for exposure on which said second partial optical system is provided, and including at least a substrate stage which holds said substrate exposed by said energy beam outgoing from said mask; and
providing a connecting section in between said first frame and said second frame which encloses an optical path of said energy beam between said first frame and said second frame, and limits the amount of vibration which travels between said first frame and said second frame.

24. A making method of an illuminating optical apparatus to illuminate an object with an energy beam from a light source, comprising:
providing at least one of a first optical member which is arranged in between said light source and said object and is housed in a first frame, and said first optical member being movable in said first frame;
providing a plurality of second optical members which are arranged in between said first optical member and said object and are respectively housed in a plurality of second frames different from said first frame, and of which a movable amount is smaller than a movable amount of said first optical member;
providing a first connecting member in between said first frame and said second frame which encloses an optical path of said energy beam between said first frame and said second frame, and displaceably connects said first frame to said second frame; and
providing a second connecting member among said second frames which connects said second frames so as to suppress a displacement among said second frames.

25. A device manufacturing method comprising:
performing exposure by using the exposure apparatus according to claim 11.

26. A device manufacturing method comprising:
performing exposure by using the exposure apparatus according to claim 12.

27. A device manufacturing method comprising:
performing exposure by using the exposure apparatus according to claim 13.

28. An illuminating optical apparatus according to claim 1, wherein said first optical member is a movable blade which changes an illuminating area of said energy beam on said object.

29. An illuminating optical apparatus according to claim 1, wherein said plurality of second optical members include an optical element which is stationary while said first optical member is moving.

30. An exposure apparatus according to claim 13, wherein said first partial optical system includes an optical element which is movable in an optical axis direction of said energy beam, as said first movable section.

31. An exposure apparatus according to claim 13, wherein said suppressing member is a freely expansible bellows-shaped member of which at least an inner surface is chemically cleaned.

32. An exposure apparatus according to claim 13 wherein said optical element included in said first partial optical system is stationary during exposure.

* * * * *